United States Patent
Lee et al.

(10) Patent No.: US 12,501,608 B2
(45) Date of Patent: Dec. 16, 2025

(54) SEMICONDUCTOR DEVICE HAVING DIFFERENT EXTENDING ACTIVE LAYERS

(71) Applicant: Samsung Electronics Co., Ltd., Suwon-si (KR)

(72) Inventors: Seonhaeng Lee, Suwon-si (KR); Sangwoo Pae, Suwon-si (KR); Namhyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 343 days.

(21) Appl. No.: 18/089,956

(22) Filed: Dec. 28, 2022

(65) Prior Publication Data

US 2023/0328964 A1 Oct. 12, 2023

(30) Foreign Application Priority Data

Apr. 6, 2022 (KR) .......................... 10-2022-0042842

(51) Int. Cl.
*H10B 12/00* (2023.01)

(52) U.S. Cl.
CPC ................................ *H10B 12/315* (2023.02)

(58) Field of Classification Search
None
See application file for complete search history.

(56) References Cited

U.S. PATENT DOCUMENTS

| | | |
|---|---|---|
| 8,017,479 B2 | 9/2011 | Kim |
| 10,347,639 B1 * | 7/2019 | Ujihara ................. H01L 23/528 |
| 10,714,482 B1 | 7/2020 | Takesako et al. |
| 10,748,994 B2 | 8/2020 | Reznicek et al. |
| 10,886,375 B2 | 1/2021 | Lee et al. |

(Continued)

FOREIGN PATENT DOCUMENTS

| KR | 1020050002259 A | 1/2005 |
|---|---|---|
| KR | 1020110102738 A | 9/2011 |

(Continued)

*Primary Examiner* — Steven M Page
(74) *Attorney, Agent, or Firm* — Muir Patent Law, PLLC

(57) ABSTRACT

A semiconductor device includes a first fin pattern protruding from a substrate and extending in a first direction; first and second active layers extending in the first direction on the first fin pattern, the second active layer being at a level higher than a level of the first active layer, the first and second active layers forming a first active layer structure; a first gate intersecting the first and second active layers, surrounding upper and lower surfaces and opposing side surfaces of each of the first and second active layers, and extending in a second direction; and a second gate intersecting the first and second active layers, surrounding upper and lower surfaces and opposing side surfaces of each of the first and second active layers, extending in the second direction, and disposed to be parallel to the first gate. The first active layer includes a first region extending from a first overlapping region of the first active layer overlapping the first gate by a first length in a direction away from the second gate, and the second active layer includes a first region extending from a first overlapping region of the second active layer overlapping the first gate by a second length in a direction away from the second gate, the second length shorter than the first length.

20 Claims, 20 Drawing Sheets

(56) References Cited

U.S. PATENT DOCUMENTS

| | | |
|---|---|---|
| 11,121,044 B2 | 9/2021 | Cheng et al. |
| 11,462,586 B1* | 10/2022 | Sekar ................. H10D 84/0149 |
| 12,127,387 B2* | 10/2024 | Liaw ................. H10D 30/6735 |
| 2004/0262676 A1 | 12/2004 | Lee et al. |
| 2012/0326219 A1* | 12/2012 | Lu ...................... H10D 30/6735 |
| | | 257/296 |
| 2020/0105751 A1 | 4/2020 | Dewey et al. |
| 2020/0411594 A1* | 12/2020 | Sekar ..................... H10D 86/01 |
| 2021/0305098 A1 | 9/2021 | Lilak et al. |
| 2022/0278092 A1* | 9/2022 | Chen ................... H01L 23/5222 |
| 2023/0032523 A1* | 2/2023 | Liaw ..................... H10B 10/18 |
| 2023/0328964 A1* | 10/2023 | Lee ..................... H10B 12/315 |
| | | 257/296 |

FOREIGN PATENT DOCUMENTS

| | | |
|---|---|---|
| KR | 1020210014910 A | 2/2021 |
| KR | 1020220003270 A | 1/2022 |

* cited by examiner

SEMICONDUCTOR DEVICE HAVING DIFFERENT EXTENDING ACTIVE LAYERS

CROSS-REFERENCE TO RELATED APPLICATION(S)

This application claims benefit of priority to Korean Patent Application No. 10-2022-0042842 filed on Apr. 6, 2022 in the Korean Intellectual Property Office, the disclosure of which is incorporated herein by reference in its entirety.

BACKGROUND

The present inventive concept relates to a semiconductor device.

According to the development of the electronics industry and the needs of users, electronic devices have been reduced in size and implemented with higher performance. Accordingly, semiconductor devices used in electronic devices are also required to be highly integrated and to have high performance. In order to manufacture a highly scaled semiconductor device, various studies have been conducted.

SUMMARY

An aspect of the present inventive concept is to provide a semiconductor device having improved electrical characteristics and integration.

According to an aspect of the present inventive concept, a semiconductor device includes: a first fin pattern protruding from a top surface of a substrate and extending in a first direction; a first active layer and a second active layer extending in the first direction on the first fin pattern, the second active layer being disposed at a level higher than a level of the first active layer, the first active layer and the second active layer forming a first active layer structure; a first gate intersecting the first and second active layers, surrounding upper and lower surfaces and opposing side surfaces of each of the first and second active layers, and extending in a second direction, intersecting the first direction; a second gate intersecting the first and second active layers, surrounding upper and lower surfaces and opposing side surfaces of each of the first and second active layers, extending in the second direction, and disposed to be parallel to the first gate; first to third contact plugs on the first active layer structure; first and second capacitors electrically connected to the first and second contact plugs, respectively; and a first bit line electrically connected to the third contact plug and extending in the second direction, wherein the first active layer includes a first region extending from a first overlapping region of the first active layer overlapping the first gate by a first length in a direction away from the second gate, and the second active layer includes a first region extending from a first overlapping region of the second active layer overlapping the first gate by a second length in a direction away from the second gate, the second length shorter than the first length.

According to an aspect of the present inventive concept, a semiconductor device includes: a first fin pattern protruding from a substrate and extending in a first direction; a second fin pattern protruding from the substrate, extending in the first direction, and disposed to be parallel to the first fin pattern; a first active layer extending in the first direction on the first fin pattern; a second active layer extending in the first direction on the second fin pattern; a first gate intersecting the first and second active layers, surrounding upper and lower surfaces and opposing side surfaces of each of the first and second active layers, and extending in a second direction, intersecting the first direction; a second gate intersecting the first and second active layers, surrounding upper and lower surfaces and opposing side surfaces of each of the first and second active layers, extending in the second direction, and disposed to be parallel to the first gate; a first bit line contact plug directly connected to the first active layer between the first gate and the second gate; a second bit line contact plug directly connected to the second active layer between the first gate and the second gate; a first bit line connected to the first bit line contact plug and extending in the second direction; a second bit line connected to the second bit line contact plug and extending in the second direction; a first additional contact plug directly connected to a first region of the first active layer; and a second additional contact plug directly connected to a first region of the second active layer; wherein the first region of the first active layer is a region extending from the second gate from a first overlapping region of the first active layer overlapping the first gate in a direction away from the second gate, the first region of the second active layer is a region extending from a first overlapping region of the second active layer overlapping the first gate in a direction away from the second gate, and the first region of the second active layer is disposed at a level higher than a level of the first region of the first active layer.

According to an aspect of the present inventive concept, a semiconductor device includes: a first fin pattern protruding from a substrate and extending in a first direction; a second fin pattern protruding from the substrate, extending in the first direction, and disposed to be parallel to the first fin pattern; a first active layer extending in the first direction on the first fin pattern; a second active layer extending in the first direction on the second fin pattern; a first gate intersecting the first and second active layers, surrounding upper and lower surfaces and opposing side surfaces of each of the first and second active layers, and extending in a second direction, intersecting the first direction; a second gate intersecting the first and second active layers, surrounding upper and lower surfaces and opposing side surfaces of each of the first and second active layers, extending in the second direction, and disposed to be parallel to the first gate, the first gate including a first side surface facing the second gate and a second side surface opposite to the first side surface; a first contact plug directly connected to a first region of the first active layer on the second side surface of the first gate; a second contact plug directly connected to a first region of the second active layer on the second side surface of the first gate; a first lower electrode of a first capacitor connected to the first contact plug; and a second lower electrode of a second capacitor connected to the second contact plug. The first region of the second active layer is disposed at a level higher than a level of the first region of the first active layer. The first lower electrode of the first capacitor vertically overlaps the first contact plug and the first gate. the second lower electrode of the second capacitor vertically overlaps the second contact plug and the first gate.

According to an aspect of the present inventive concept, a semiconductor device includes: first to fourth fin patterns protruding from a substrate and extending in a first direction; first to fourth active layer groups respectively disposed on the first to fourth fin patterns, each of the first to fourth active layer groups including a plurality of active layers disposed on different levels on a respective fin pattern of the first to fourth fin patterns; a first gate and a second gate extending in a second direction, intersecting the first direction, and surrounding upper and lower surfaces and opposing side surfaces of each of the plurality of active layers; and first to fourth bit lines electrically connected to the first to fourth active layer groups, respectively, between the first gate and the second gate, wherein the first to fourth active layer groups are arranged in a zigzag shape in which heights are varied in a third direction when traversing in the second direction when viewed from the first direction, and the third direction is perpendicular to an upper surface of the substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
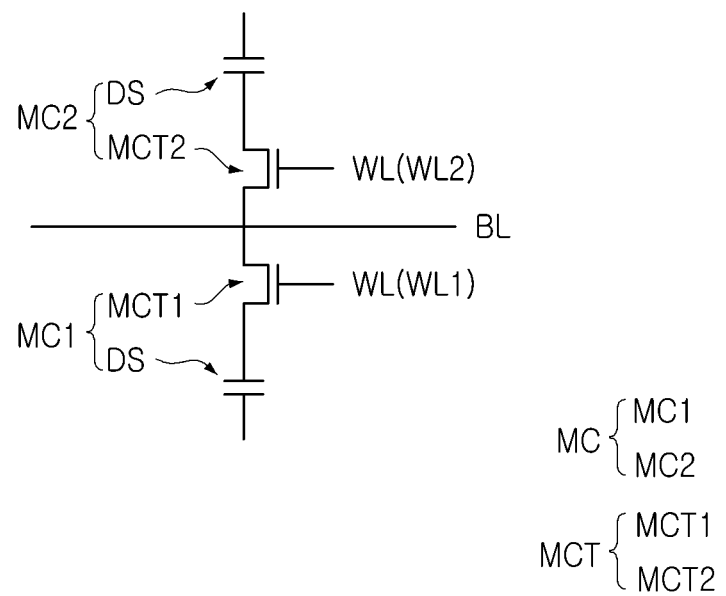
FIG. 1 is a simplified circuit diagram illustrating a memory cell array of a semiconductor device according to an example embodiment.

FIG. 1 is a simplified circuit diagram illustrating a memory cell array of a semiconductor device according to an example embodiment.

Referring to FIG. 1, a memory cell array of a semiconductor device according to an example embodiment may include word lines WL, bit lines BL, and memory cells MC. The memory cells MC may include memory cell transistors MCT and a data storage elements DS.

The memory cells MC may include a first memory cell MC1 and a second memory cell MC2, and the first memory cell MC1 and the second memory cell MC2 may be connected to a common bit line BL. The first memory cell MC1 may be connected to a first word line WL1, and the second memory cell MC2 may be connected to a second word line WL2. According to an example embodiment, the circuit diagram of FIG. 1 may be implemented by, for example, a semiconductor device as illustrated in FIGS. 2A to 2C.

Figure 2A:
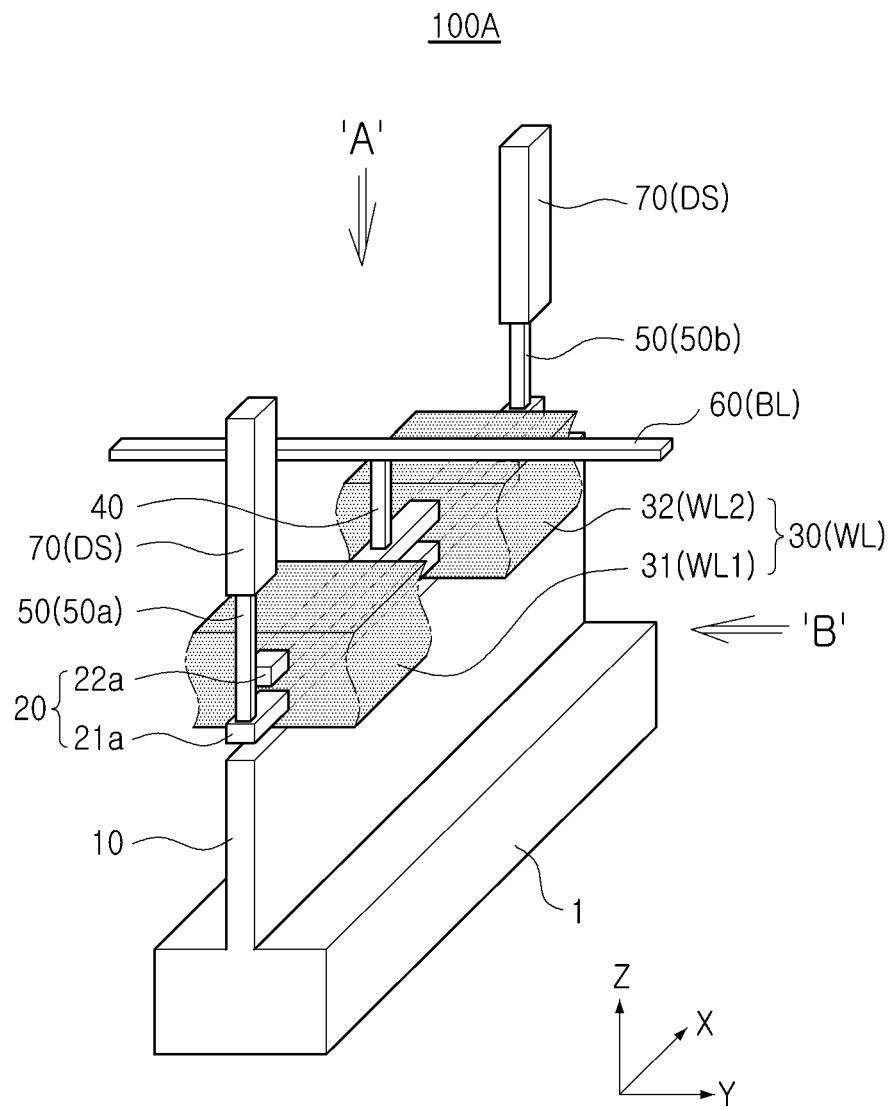
FIG. 2A is a schematic perspective view of a semiconductor device according to an example embodiment.

FIG. 2A is a schematic perspective view of a semiconductor device according to an example embodiment.

Figure 2B:
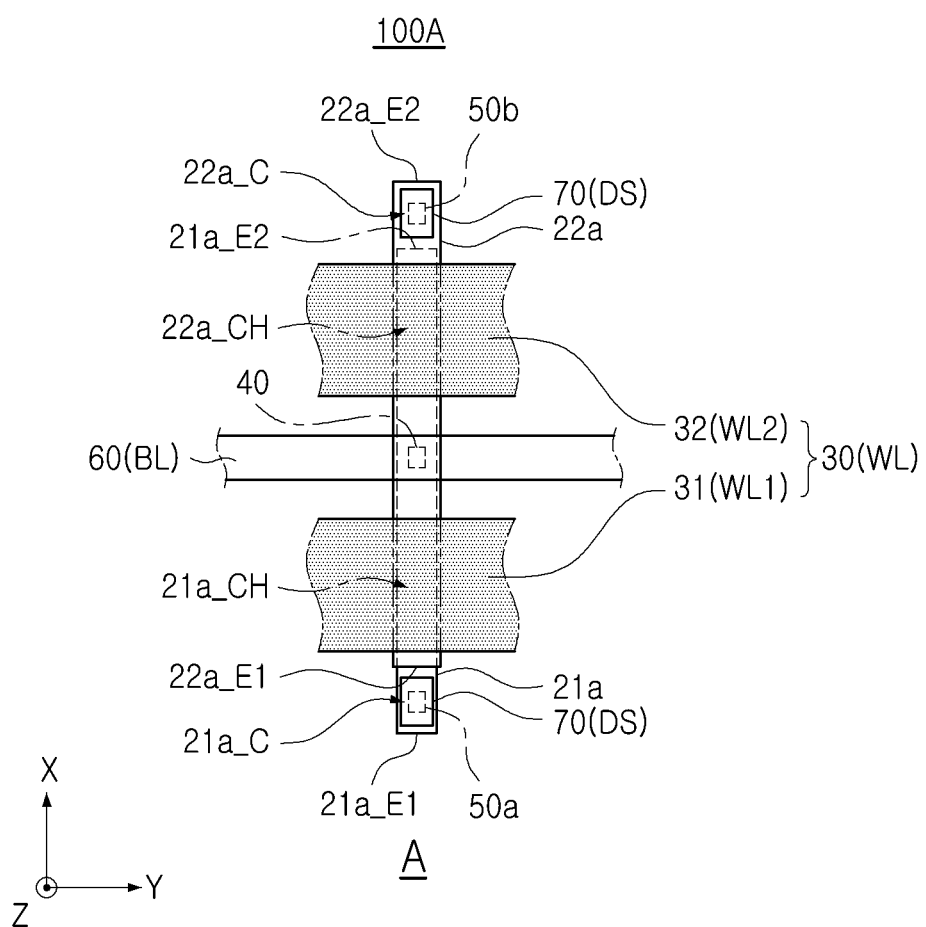
FIG. 2B is a view of the semiconductor device of FIG. 2A as viewed from a direction 'A;'
Figure 2C:
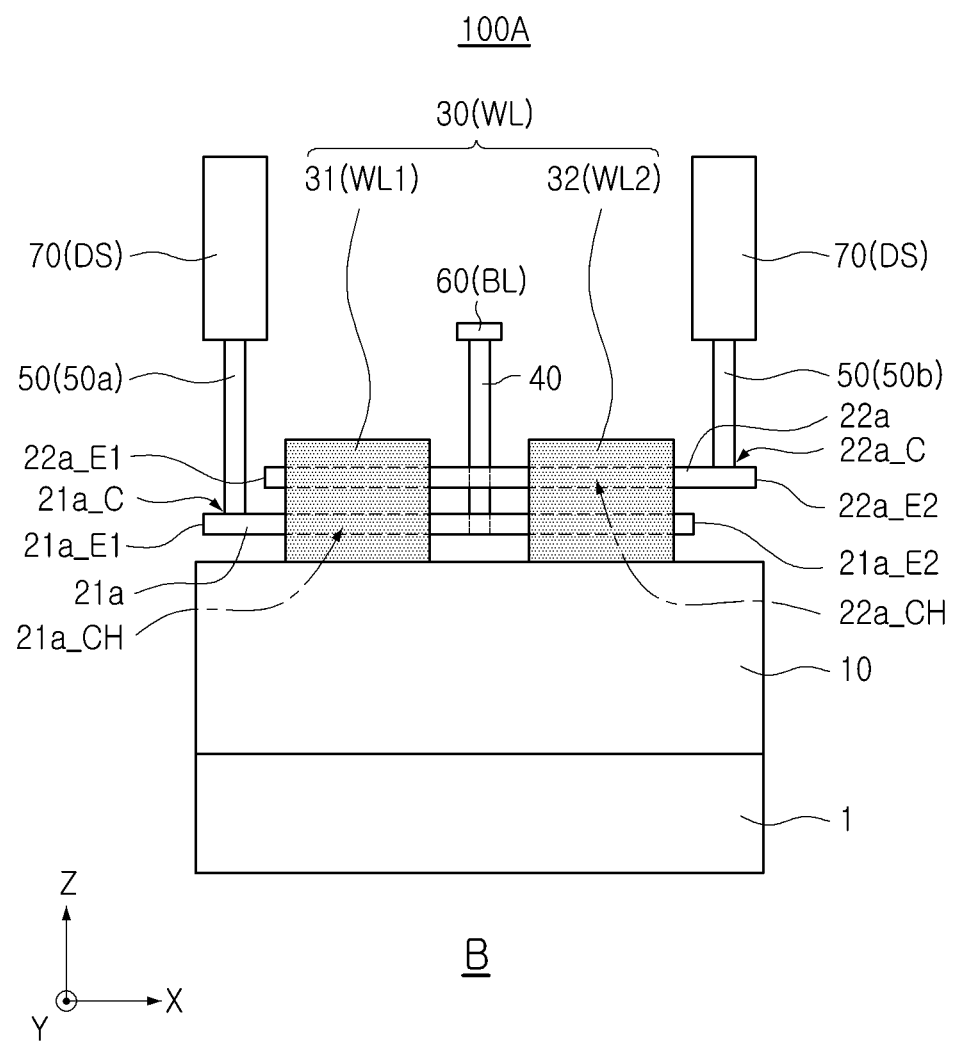
FIG. 2C is a view of the semiconductor device of FIG. 2A as viewed from a direction 'B;'

FIG. 2B is a view of the semiconductor device of FIG. 2A as viewed from a direction 'A', and FIG. 2C is a view of the semiconductor device of FIG. 2A as viewed from a direction 'B'. The direction 'A' may be parallel to a Z-direction, and the direction 'B' may be parallel to a Y-direction. For example, a Z-direction may be a direction perpendicular to a top surface of a substrate.

Referring to FIGS. 2A to 2C, a semiconductor device 100A according to an example embodiment may include a substrate 1, a fin pattern 10 protruding from a top surface of the substrate 1 and extending in the X-direction, a plurality of active layers 20 stacked to be spaced apart from each other on the fin pattern 10 and extending in the X-direction, a plurality of gates 30 intersecting the plurality of active layers 20 and extending in the Y-direction intersecting the X-direction, a bit line contact plug 40 and capacitor contact plugs 50 connected to the plurality of active layers 20, a wiring layer 60 connected to the bit line contact plug 40, and capacitors 70 connected to the capacitor contact plugs 50. The plurality of gates 30 may correspond to the word lines WL of FIG. 1, the wiring layer 60 may correspond to the bit line BL of FIG. 1, and the capacitors 70 may correspond to the data storage elements DS of FIG. 1. Items described herein as extending in a direction, or extending lengthwise in a direction, extend longer in the stated direction than in a direction perpendicular to the stated direction. Items described as extending in a particular direction horizontally extend longer in the particular direction than in a horizontal direction perpendicular to the particular direction. Similarly, items described herein as extending lengthwise vertically extends longer in the vertical direction than in at least one horizontal direction perpendicular the vertical direction.

The semiconductor device 100A may include, for example, a cell array of a dynamic random access memory (DRAM). For example, a first gate 31, which is the first word line WL1, and a first active layer 21a may configure (e.g., form) a first memory cell transistor MCT1 of FIG. 1, and a second gate 32, which is the second word line WL2, and a second active layer 22a may configure (e.g., form) a second memory cell transistor MCT2 of FIG. 1, and the wiring layer 60, which is the bit line BL, may be electrically connected to the first active layer 21a and the second active layer 22a. The first active layer 21a and second active layer 22a may be described as an active layer structure. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

According to the present inventive concept, as illustrated in FIGS. 2A to 2C, the memory cell MC of FIG. 1 may include multi bridge channel field effect transistors (MBCFET™s), gate-all-around FETs (GAAFETs), nanosheet transistors, or nano-wire transistors in which a channel of a transistor is formed in a region of one of the plurality of active layers 20 surrounded by one of the plurality of gates 30. Since the memory cells MC have the transistor structure as described above, a leakage current may be reduced in an OFF state and a current may be increased in an ON state, thereby significantly improving electrical characteristics of the device.

The substrate 1 may include or be formed of a semiconductor material, for example, a group IV semiconductor, a group III-V compound semiconductor, or a group II-VI compound semiconductor. For example, the group IV semiconductor may be silicon, germanium, or silicon-germanium, for example. The substrate 1 may further include impurities. The substrate 1 may include or be a silicon substrate, a silicon-on-insulator (SOI) substrate, a germanium substrate, a germanium-on-insulator (GOI) substrate, a silicon-germanium substrate, or a substrate including an epitaxial layer.

The fin pattern 10 may be defined or confined on the substrate 1 by a device separation layer. The fin pattern 10 may be disposed to extend horizontally in the X-direction. The fin pattern 10 may have a fin structure. The fin pattern 10 may have, for example, a structure protruding from a top surface of the substrate 1 in the Z-direction. The fin pattern 10 may be formed as a portion of the substrate 1 or may include an epitaxial layer grown from the substrate 1. The fin pattern 10 may be formed of the same material as the substrate 1. In some example embodiments, the fin pattern 10 may include impurities, but it is not limited thereto.

The fin pattern 10 may have a predetermined width in the Y-direction, and according to example embodiments, the fin patterns 10 disposed in different regions may have different widths. An upper width of the fin pattern 10 may be narrower than a lower width of the fin pattern 10, and side surfaces thereof may be inclined with respect to the upper surface of the substrate 1. The device separation layer may be formed by, for example, a shallow trench isolation (STI) process.

The plurality of active layers 20 may include a first active layer 21a and a second active layer 22a disposed to overlap the fin pattern 10 in the Z-direction (e.g., to overlap from a plan view). The first active layer 21a and the second active layer 22a may be disposed on different height levels. For example, the second active layer 22a may be disposed on a level higher than a level of the first active layer 21a. The term 'level' used in the present disclosure may be defined with respect to the upper surface of the substrate 1, and for example, a higher level or a lower level means that a height from the upper surface of the substrate 1 is higher or lower. The height or level may also be determined with respect to a bottom or lower surface of the substrate 1. Each of the first active layer 21a and the second active layer 22a may include or may be a semiconductor material, and may include N-type or P-type impurities. The first active layer 21a and the second active layer 22a may be electrically separated from each other.

The first active layer 21a may include a first channel region 21a CH surrounded by the first gate 31 and a first region 21a_C extending from the first channel region 21a_CH. The second active layer 22a may include a second channel region 22a_CH surrounded by the second gate 32 and a second region 22a_C extending from the second channel region 22a_CH. The first gate 31 may include a first side surface and a second side surface that are opposite to each other, and the second gate 32 may include a third side surface and a fourth side surface that are opposite to each other, and the first side surface of the gate 31 and the third side surface of the second gate 32 may face each other. The first region 21a_C of the first active layer 21a may protrude from the second side surface of the first gate 31, and the second region 22a_C of the second active layer 22a may protrude from the fourth side surface of the second gate 32.

The first active layer 21a and the second active layer 22a may be disposed so as not to fully overlap each other in the Z-direction to provide the first region 21a_C and the second region 22a_C, respectively. For example, to provide a first region 21a_C in the first active layer 21a disposed below the second active layer 22a, the second active layer 22a may extend to be shorter than the first active layer 21a from the second side surface of the first gate 31. In this case, based on the second side surface of the first gate 31, a first end surface 21a_E1 of the first active layer 21a may be disposed to be farther than a first end surface 22a_E1 of the second active layer 22a. That is, the first end surface 21a_E1 of the first active layer 21a and the first end surface 22a_E1 of the second active layer 22a may not be aligned with each other in the Z-direction (e.g., may not overlap from a plan view) and may be staggered with respect to each other in the X-direction when viewed in the Z direction.

The first active layer 21a may include the first region 21a_C extending by a first length in a direction away from the second gate 32 from a first overlapping region 21a CH of the first active layer 21a overlapping the first gate WL1, and the second active layer 22a may include a first region extending by a second length in a direction away from the second gate 32, shorter than the first length, from the first overlapping region of the second active layer 22a overlapping the first gate WL1. The second active layer 22a may include a second region 22a_C extending from the second overlapping region 22a_CH overlapping the second gate 32 in a direction away from the first gate 31.

The first end surface 22a_E1 of the second active layer 22a facing in the X-direction may overlap the first active layer 21a in the Z-direction. For example, the first end surface 22a_E1 of the second active layer 22a may vertically overlap a portion of the first active layer 21a located the first region 21a_C of the first active layer 21a and the first channel region 21a_CH of the first active layer 21a. The first end surface 22a_E1 of the second active layer 22a may be spaced apart from a side surface of the first contact plug 50a and may face the side surface of the first contact plug 50a. With respect to the fourth side surface of the second gate 32, the second end surface 22a_E2 of the second active layer 22a may be disposed to be farther than the second end surface 21a E2 of the first active layer 21a, but is not limited thereto.

When the first and second active layers 21a and 22a are formed of a semiconductor material, the first region 21a_C and the second region 22a_C may each include impurities, and the impurities may have a conductivity type of N-type or P-type.

In another example embodiment, each of the plurality of active layers 20 may include or be formed of an oxide semiconductor, for example, at least one of hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), and indium-tin-zinc oxide (ITZO).

In another example embodiment, each of the plurality of active layers 20 may include or be formed of a two-dimensional (2D) material in which atoms may form a predetermined crystal structure and form a channel of a transistor. The 2D material layer may include or be formed of at least one of a transition metal dichalcogenide material layer (TMD), a black phosphorous material layer, and a hexagonal boron-nitride (hBN) material layer. For example, the 2D material layer may include or be formed of at least one of BiOSe, CrI, $WSe_2$, $MoS_2$, TaS, WS, SnSe, ReS, β-SnTe, MnO, AsS, P(black), InSe, h-BN GaSe, GaN, SrTiO, MXene, and Janus 2D materials.

According to an example of the present inventive concept, each of the active layers 20 disposed on one fin pattern 10 may serve as active layers of separate and distinct memory cell transistors. Since the number of memory cell transistors corresponding to the stacked number of the active layers 20 may be implemented, the degree of integration of the semiconductor device may be improved.

In an example embodiment, epitaxial layers may be grown on the plurality of active layers 20 exposed from the gates 30 through a selective epitaxial growth process. The epitaxial layers may have a greater width and greater thickness than the active layers 20 (e.g., when viewed in a direction perpendicular to the Y-Z plane). The epitaxial layers may not contact each other. The epitaxial layers may include impurities.

The plurality of gates 30 intersect or cross over the fin pattern 10, intersect the plurality of active layers 20 on the fin pattern 10, and have upper and lower surfaces and opposing side surfaces on each of the plurality of active layers 20. Opposite side surfaces of the plurality of active layers 20 surrounded by the plurality of gates 30 may be opposite each other in the Y-direction. The gates 30 serving as the word lines WL may extend in the same direction as that of the wiring layer 60 serving as the bit line BL (note in FIGS. 2A-2C, only a portion of the word lines WL are shown and the full extended word line extending in the Y direction is cut off for simplicity). Each of the plurality of gates 30 may include or be formed of at least one of a doped semiconductor material, a metal material, a metal nitride, and a metal oxynitride.

The plurality of gates 30 may include a first gate 31 and a second gate 32 parallel to each other and extending in the Y-direction. The first gate 31 and the second gate 32 may each be disposed between the fin pattern 10 and the first active layer 21a, between the first active layer 21a and the second active layer 22a, and on the second active layer 22a (e.g., above the second active layer 22a). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.). The first active layer 21a may extend continuously in the X-direction from a portion crossing the first gate 31 to cross the second gate 32, and the second active layer 22a may also extend continuously in the X-direction from the portion crossing the first gate 31 to cross the second gate 32.

In an example embodiment, each of the plurality of gates 30 may include a gate dielectric layer surrounding and in contact with the plurality of active layers 20 and a gate electrode surrounding the gate dielectric layer. In another example embodiment, the plurality of gates 30 may further include gate spacers covering a side surface of the gate electrode and a gate capping layer covering an upper surface of the gate electrode.

The bit line contact plug 40 may be disposed between the first side surface of the first gate 31 and the third side surface of the second gate 32 facing each other and may be connected to the first active layer 21a through the second active layer 22a. The bit line contact plug 40 may pass through a portion positioned between the first gate 31 and the second gate 32 among portions in which the second active layer 22a overlaps the first active layer 21a. The bit line contact plug 40 may be electrically connected to a partial region of the first active layer 21a between the first and second gates 31 and 32 and a partial region of the second active layer 22a between the first and second gates 31 and 32. The bit line contact plug 40 may be disposed to be in contact with the first active layer 21a, to partially recess the first active layer 21a, or to pass through at least a portion of the first active layer 21a.

The capacitor contact plugs 50 may include first and second contact plugs 50a and 50b respectively connected to the first and second active layers 21a and 22a in the first and second regions 21a_C and 22a_C. The first contact plug 50a may be directly connected to the first region 21a_C of the first active layer 21a protruding from the second side surface of the first gate 31, and the second contact plug 50b may be directly connected to the second region 22a_C of the second active layer 22a protruding from the fourth side surface of the second gate 32. The first contact plug 50a may not vertically overlap the second active layer 22a. Lower ends of the first and second contact plugs 50a and 50b may be disposed on different height levels. For example, the lower end of the second contact plug 50b connected to the first region 22a_C of the second active layer 22a may be disposed on a level higher than a level of the lower end of the first contact plug 50a connected to the first region 21a_C of the first active layer 21a.

Each of the bit line contact plug 40 and the capacitor contact plugs 50 may include or be formed of a metal-semiconductor compound layer, a barrier layer on the metal-semiconductor compound layer, and a plug layer on the barrier layer. Accordingly, each of the bit line contact plug 40 and the capacitor contact plugs 50 may be described as conductive plugs.

The metal-semiconductor compound layer may include or may be, for example, metal silicide, metal germanide, or metal silicide-germanide. In the metal-semiconductor compound layer, the metal may be titanium (Ti), nickel (Ni), tantalum (Ta), cobalt (Co), or tungsten (W), and the semiconductor may be silicon (Si), germanium (Ge), silicon germanium (SiGe). For example, the metal-semiconductor compound layer may include at least one of cobalt silicide (Coosa), titanium silicide (TiSi), nickel silicide (NiSi), and tungsten silicide (WSi).

The barrier layer may include or be formed of metal nitride, for example, at least one of titanium nitride (TiN), tantalum nitride (TaN), and tungsten nitride (WN). The plug layer may include at least one of a metal material, for example, aluminum (Al), copper (Cu), tungsten (W), cobalt (Co), ruthenium (Ru), or molybdenum (Mo).

The wiring layer 60 may be connected to the bit line contact plug 40 and may extend in the Y-direction. The bit line BL of the wiring layer 60 may extend in the same direction as an extension direction of the word lines WL of the gates 30. The wiring layer 60 may include a barrier layer and a conductive material layer on the barrier layer. The barrier layer may include or be formed of the same material as the material described above, and the conductive material layer may include or be formed of the same material as that of the plug layer.

The capacitors 70 may be respectively connected to the capacitor contact plugs 50a and 50b. Each of the capacitors 70 may include a lower electrode, a dielectric layer on the lower electrode, and an upper electrode on the dielectric layer. The lower electrode of each capacitor 70 may have one or various shapes, such as a cylinder shape or a pillar shape, according to example embodiments. In the present inventive concept, a structure of the capacitors 70 is not particularly limited. As discussed above and below, items described as "connected to" each other may be both physically connected, and may also be electrically connected where an electrical signal or voltage can pass from one item to the other item.

Figure 3:
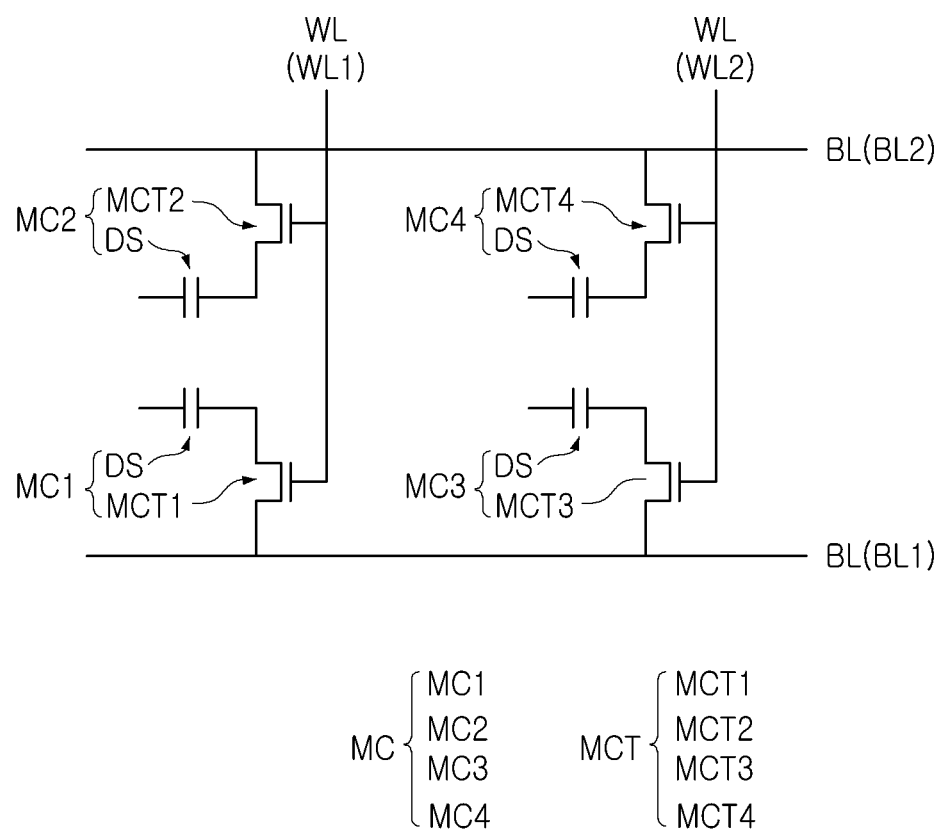
FIG. 3 is a simplified circuit diagram illustrating a memory cell array of a semiconductor device according to an example embodiment.

FIG. 3 is a simplified circuit diagram illustrating a memory cell array of a semiconductor device according to an example embodiment.

Referring to FIG. 3, a memory cell array of a semiconductor device according to an example embodiment may include word lines WL, bit lines BL, and memory cells MC. The memory cells MC may include first to fourth memory cells MC1, MC2, MC3, and MC4. The first and second memory cells MC1 and MC2 may be connected to a first word line WL1. The third and fourth memory cells MC3 and MC4 may be connected to a second word line WL2. The first and third memory cells MC1 and MC3 may be connected to a first bit line BL1. The second and fourth memory cells MC2 and MC4 may be connected to a second bit line BL2. According to an example embodiment, the circuit diagram of FIG. 3 may be implemented as, for example, the semiconductor device illustrated in FIGS. 4A to 4C.

Figure 4A:
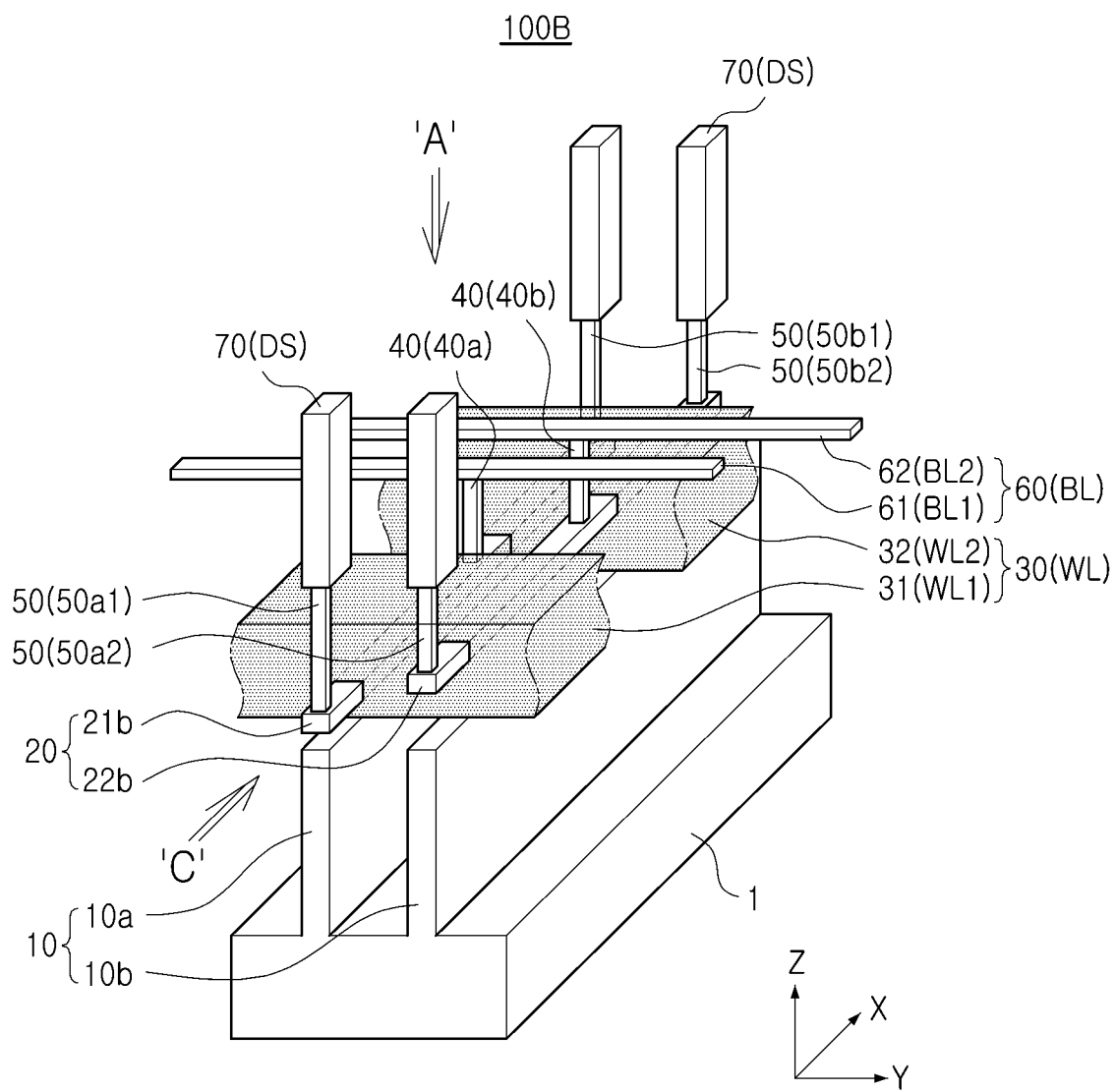
FIG. 4A is a schematic perspective view of a semiconductor device according to an example embodiment.

FIG. 4A is a schematic perspective view of a semiconductor device according to an example embodiment.

Figure 4B:
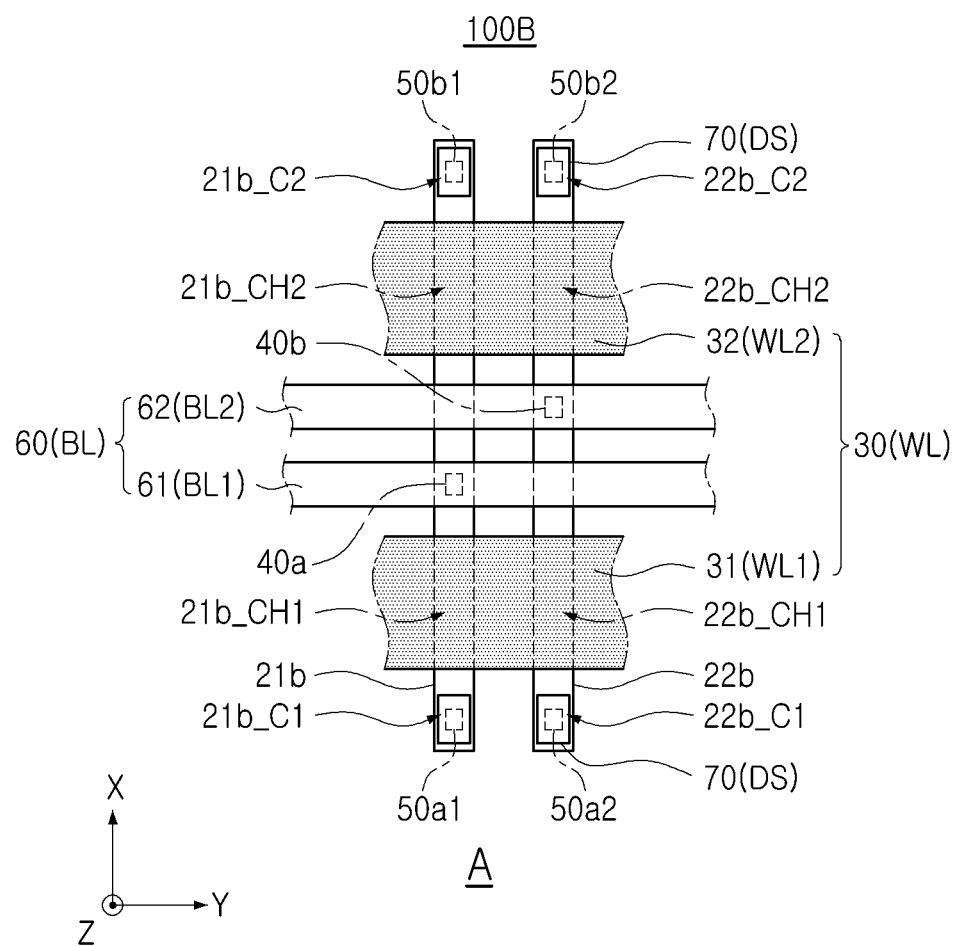
FIG. 4B is a view of the semiconductor device of FIG. 4A as viewed from the direction 'A;'
Figure 4C:
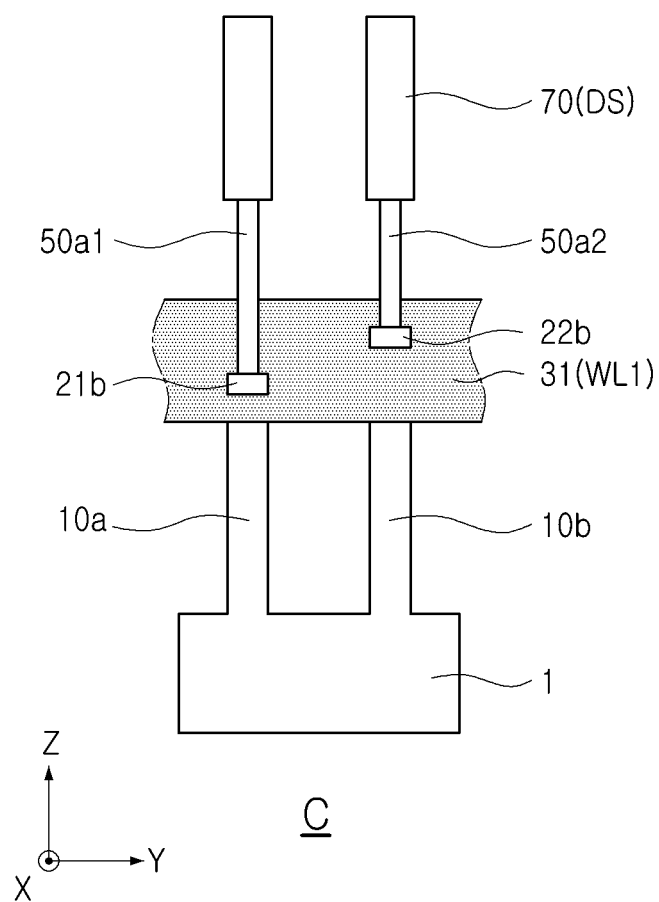
FIG. 4C is a view of the semiconductor device of FIG. 4A as viewed from a direction 'C;'

FIG. 4B is a view of the semiconductor device of FIG. 4A as viewed from direction 'A', and FIG. 4C is a view of the semiconductor device of FIG. 4A as viewed from direction 'C'. Direction 'A' may be parallel to the Z-direction, and direction 'C' may be parallel to the X-direction.

Referring to FIGS. 4A to 4C, a semiconductor device 100B according to an example embodiment may include a substrate 1, a plurality of fin patterns 10, a plurality of active layers 20, a plurality of gates 30, a plurality of contact plugs 40 and 50, a plurality of wiring layers 60, and a plurality of capacitors 70. The plurality of gates 30 may correspond to the word lines WL of FIG. 3, the plurality of wiring layers 60 may correspond to the bit lines BL of FIG. 3, and the plurality of capacitors 70 may correspond to the data storage elements DS of FIG. 3. The semiconductor device 100B may include a cell array of a DRAM, and a memory cell of the DRAM may include an MBCFET™, a GAAFET, a nanosheet transistor, or a nano-wire transistor.

A first gate 31, which is a first word line WL1, and a first active layer 21b may constitute the first memory cell transistor MCT1 of FIG. 3, the first gate 31 and a second active layer 22b may constitute a second memory cell transistor MCT2 of FIG. 3, and a second gate 32, which is a second word line WL2, and the first active layer 21b may constitute a third memory cell transistor MCT3 of FIG. 3. The second gate 32 and the second active layer 21b may constitute a fourth memory cell transistor MCT4 of FIG. 3.

A plurality of fin patterns 10 may extend to be parallel to each other in the X-direction. The plurality of fin patterns 10 may include a first fin pattern 10a and a second fin pattern 10b. The plurality of active layers 20 may include a first active layer 21b disposed to overlap the first fin pattern 10a in the Z-direction and a second active layer 22b disposed to overlap the second fin pattern 10b in the Z-direction. The first active layer 21b and the second active layer 22b may be disposed at different height levels. For example, the second active layer 22b may be disposed at a level higher than a level of the first active layer 21b.

The first active layer 21b may include a first channel region 21b_CH1 surrounded by the first gate 31, a second channel region 21b CH2 surrounded by the second gate 32, a first region 21b_C1 extending from a first channel region 21b_CH1 in a direction away from the second gate 32, and a second region 21b_C2 extending from the second channel region 21b CH2 in a direction away from the first gate 31. The first region 21b_C1 of the first active layer 21b may protrude from the second side surface of the first gate 31, and the second region 21b_C2 of the first active layer 21b may protrude from the fourth side surface of the second gate 32.

The first active layer 21b may further include a third region directly connected to a first bit line contact plug 40a. The first channel region 21b_CH1 of the first active layer 21b may be disposed between the first region 21b_C1 of the first active layer 21b and the third region of the first active layer 21b, and the second channel region 21b CH2 of the first active layer 21b may be disposed between the second region 21b_C2 of the first active layer 21b and the third region of the first active layer 21b. The third region of the first active layer 21b may be disposed between the first channel region 21b_CH1 of the first active layer 21b and the second channel region 21b CH2 of the first active layer 21b.

The first channel region 21b_CH1 of the first active layer 21b may be referred to as a 'first overlapping region' overlapping the first gate 31, and the second channel region 21bCH2 of the first active layer 21b may be referred to as a 'second overlapping region' overlapping the second gate 32.

The second active layer 22b may include a first channel region 22b_CH1 surrounded by the first gate 31, a second channel region 22b_CH2 surrounded by the second gate 32, a first region 22b C1 extending from the first channel region 22b_CH1 in a direction away from the second gate 32, and a second region 22b_C2 extending from the second channel region 22b_CH2 in a direction away from the first gate 31. The first region 22b C1 of the second active layer 22b may protrude from the second side surface of the first gate 31, and the second region 22b_C2 of the second active layer 22b may protrude from the fourth side surface of the second gate 32.

The second active layer 22b may further include a third region directly connected to the second bit line contact plug 40b. The first channel region 22b_CH1 of the second active layer 22b may be disposed between the first region 22b_C1 of the second active layer 22b and the third region of the second active layer 22b, the second channel region 22b_CH2 of the second active layer 22b may be disposed between the second region 22b_C2 of the second active layer 22b and the third region of the second active layer 22b. The third region of the second active layer 22b may be disposed between the first channel region 22b_CH1 of the second active layer 22b and the second channel region 22b_CH2 of the second active layer 22b.

The first channel region 22b_CH1 of the second active layer 22b may be referred to as a 'first overlapping region' overlapping the first gate 31, and the second channel region 22b_CH2 of the second active layer 22b may be referred to as a 'second overlapping region' overlapping the second gate 32.

The first active layer 21b and the second active layer 22b may be disposed on different levels in the Z-direction and may be disposed so that portions thereof do not overlap each other in the Y-direction. For example, referring to FIG. 4C in which the semiconductor device 100B is viewed from the direction 'C', the second active layer 22b may be shifted from the first active layer 21b in the Y-direction and may be disposed on a higher level in the Z-direction. Taking two active layers 21b and 22b adjacent to each other from a plan view, the first region 22b_C1 of the second active layer 22b directly connected to a second contact plug 50a2 may be disposed at a level higher than a level of the first region 21b_C1 of the first active layer 21b directly connected to a first contact plug 50a1. The second region 22b_C2 of the second active layer 22b directly connected to a fourth contact plug 50b2 may be disposed at a level higher than that of the second region 21b_C2 of the first active layer 21b directly connected to a third contact plug 50b1.

According to an example of the present inventive concept, landing margins of the capacitor contact plugs 50 may be secured by providing the first to fourth regions 21b_C1, 21b_C2, 22b_C1, and 22b_C2. Compared to a case in which the first and second active layers spaced apart from each other in the Y-direction are disposed on the same level in the Z-direction, when the first and second active layers 21b and 22b spaced apart from each other in the Y-direction are disposed on different levels in the Z-direction, the capacitor contact plugs 50 may be more stably connected to the first and second active layers 21b and 22b.

The plurality of bit line contact plugs 40 may include first and second bit line contact plugs 40a and 40b respectively connected to the first and second wiring layers 61 and 62. The first bit line contact plug 40a and the second bit line contact plug 40b may be disposed not to overlap each other in the X or Y-directions.

The plurality of capacitor contact plugs 50 may include first and second contact plugs 50a1 and 50a2 respectively connected to the first region 21b_C1 of the first active layer 21b and the first region 22b_C1 of the second active layer 22b. The plurality of capacitor contact plugs 50 may include third and fourth contact plugs 50b1 and 50b2 respectively connected to the second region 21b_C2 of the first active layer 21b and the second region 22b_C of the second active layer 22b. The first and second contact plugs 50a1 and 50a2 may overlap each other in the Y-direction, and the third and fourth contact plugs 50b1 and 50b2 may overlap each other in the Y-direction, though in some embodiments, the first and second contact plugs 50a1 and 50a2 may be positioned to not overlap each other in the Y-direction, and the third and fourth contact plugs 50b1 and 50b2 may be positioned to not overlap each other in the Y-direction.

Figure 5:
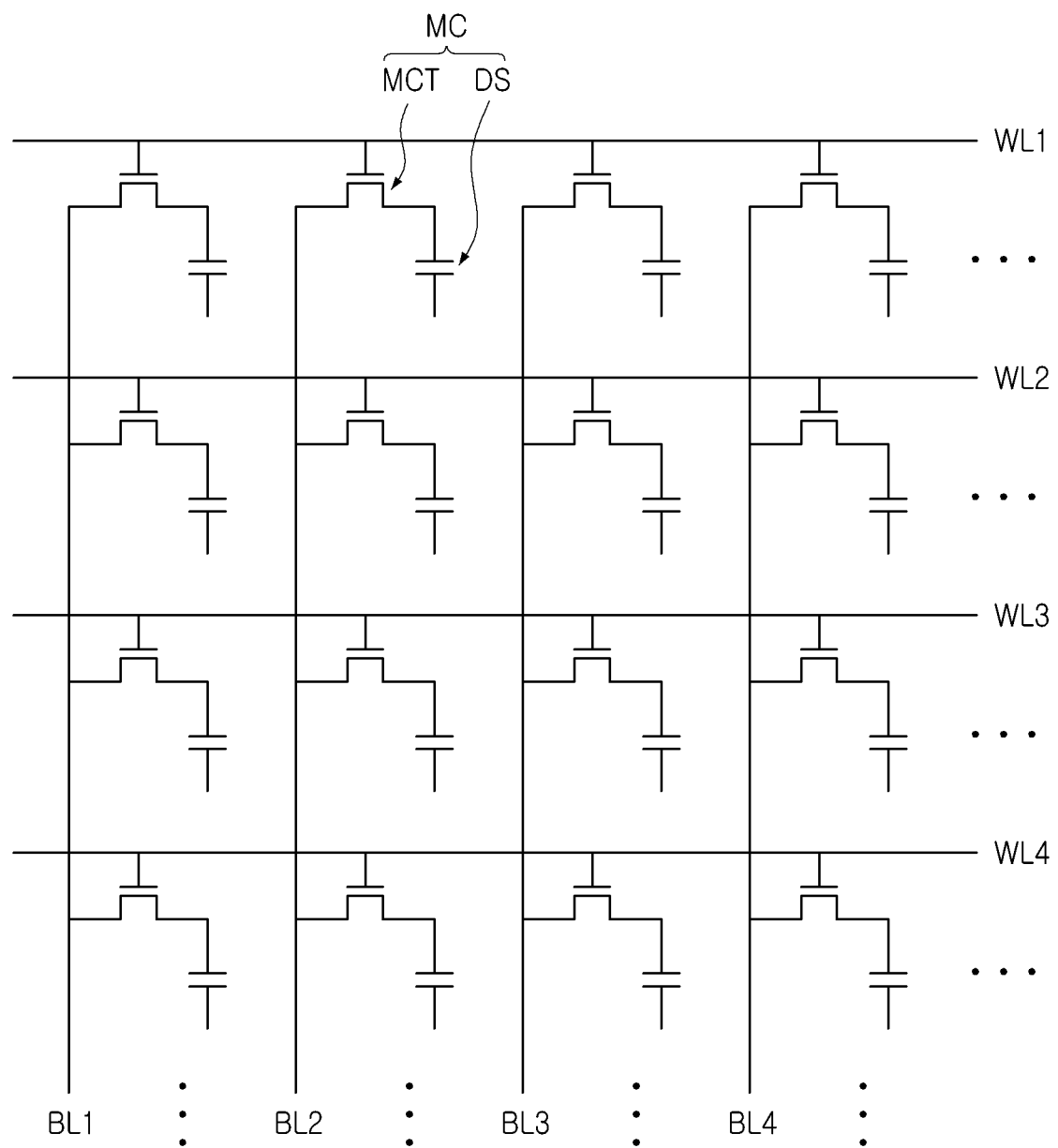
FIG. 5 is a simplified circuit diagram illustrating a memory cell array of a semiconductor device according to an example embodiment.

FIG. 5 is a simplified circuit diagram illustrating a memory cell array of a semiconductor device according to an example embodiment.

Referring to FIG. 5, a memory cell array of a semiconductor device according to an example embodiment may include a plurality of word lines WL, a plurality of bit lines BL, and a plurality of memory cells MC. The plurality of memory cells MC may be implemented with a high degree of integration by repeatedly stacking a plurality of active layers 20, a plurality of gates 30, and a plurality of wiring layers 60, as illustrated in FIGS. 6 to 9 below. A structure of the memory cell array will be further described below.

Figure 6:
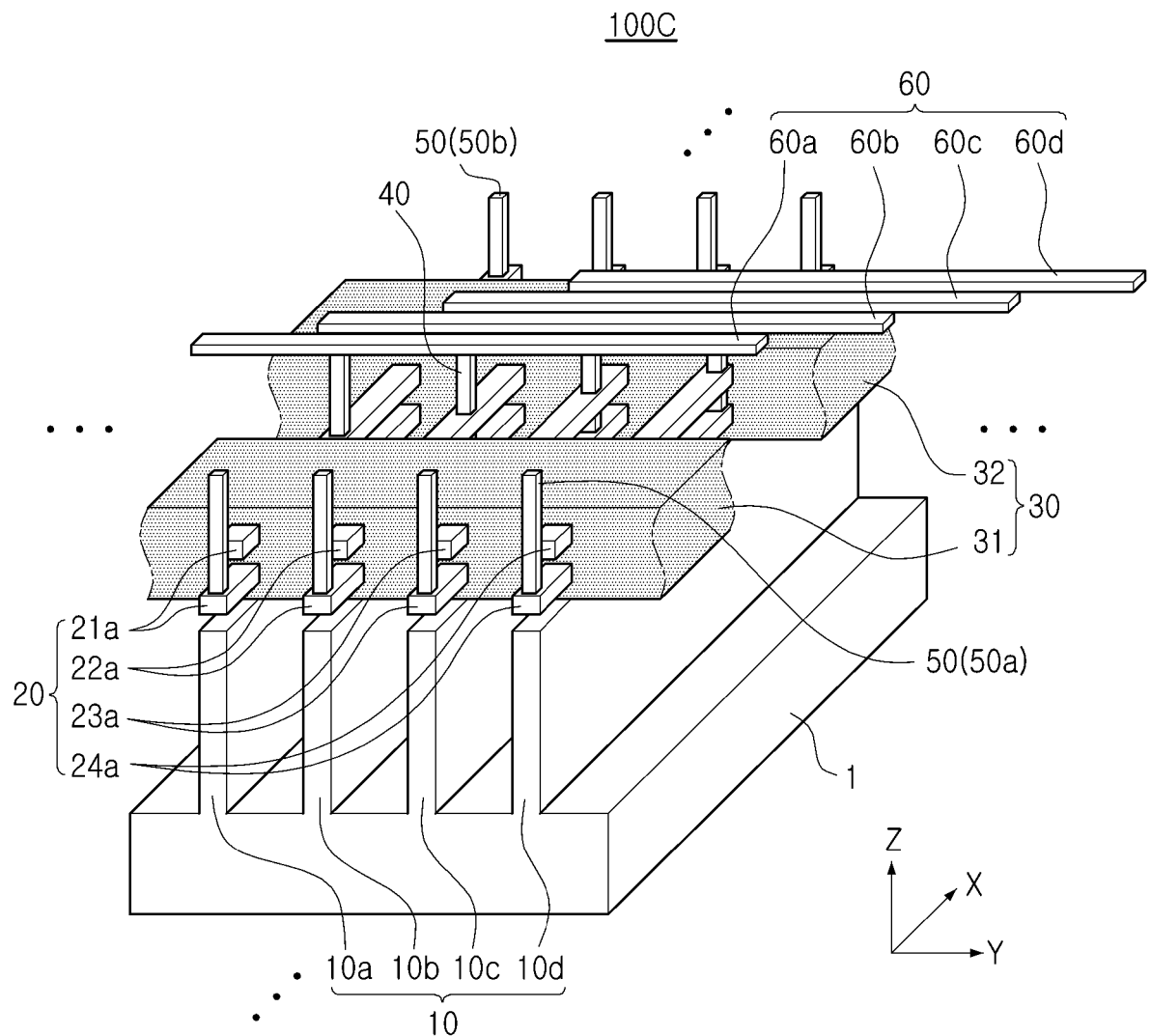
FIG. 6 is a schematic perspective view of a semiconductor device according to an example embodiment.

FIG. 6 is a schematic perspective view of a semiconductor device according to an example embodiment. In FIG. 6, display of the capacitors 70 disposed on the capacitor contact plugs 50 is omitted.

Referring to FIG. 6, in a semiconductor device 100C, a plurality of fin patterns 10 may include first to fourth fin patterns 10a, 10b, 10c, and 10d, and a plurality of active layers 20 may include first to fourth active layers 21a, 22a, 23a, and 24a disposed in positions overlapping each of the first to fourth fin patterns 10a, 10b, 10c, and 10d. The plurality of first active layers 21a may be disposed at different heights, and end surfaces thereof may be staggered from each other in the X-direction when viewed from the Z-direction. For example, a length of the first upper active layer 21a, among the plurality of first active layers 21a, extending from a region overlapping the first gate 31 in a direction away from the second gate 32 may be shorter than a length of the first lower active layer 21a extending from a region overlapping the first gate 31 in a direction away from the second gate 32. A plurality of second active layers 22a, a plurality of third active layers 23a, and a plurality of fourth active layers 24a may also be disposed to have a similar structure.

A plurality of bit line contact plugs 40 may pass through the first to fourth upper active layers 21a, 22a, 23a, and 24a and may be directly connected to the first to fourth lower active layers 21a, 22a, 23a, and 24a between the first side surface of the first gate 31 and the third side surface of the second gate 32 facing each other.

Some 50a of the plurality of capacitor contact plugs 50 may be respectively connected to the first to fourth lower active layers 21a, 22a, 23a, and 24a protruding from the second side surface of the first gate 31, and the other 50b of the plurality of capacitor contact plugs 50 may be connected to the first to fourth upper active layers 21a, 22a, 23a, and 24a protruding from the fourth side surface of the second gate 32.

The plurality of wiring layers 60 may include first to fourth wiring layers 60a, 60b, 60c, and 60d. The first wiring layer 60a may be electrically connected to the plurality of first active layers 21a through the bit line contact plug 40 passing through the first upper active layer 21a among the plurality of first active layers 21a. The second wiring layer 60b, the third wiring layer 60c, and the fourth wiring layer 60d may also be electrically connected to a plurality of second active layers 22a, a plurality of third active layers 23a, and a plurality of fourth wiring layers, respectively.

Figure 7:
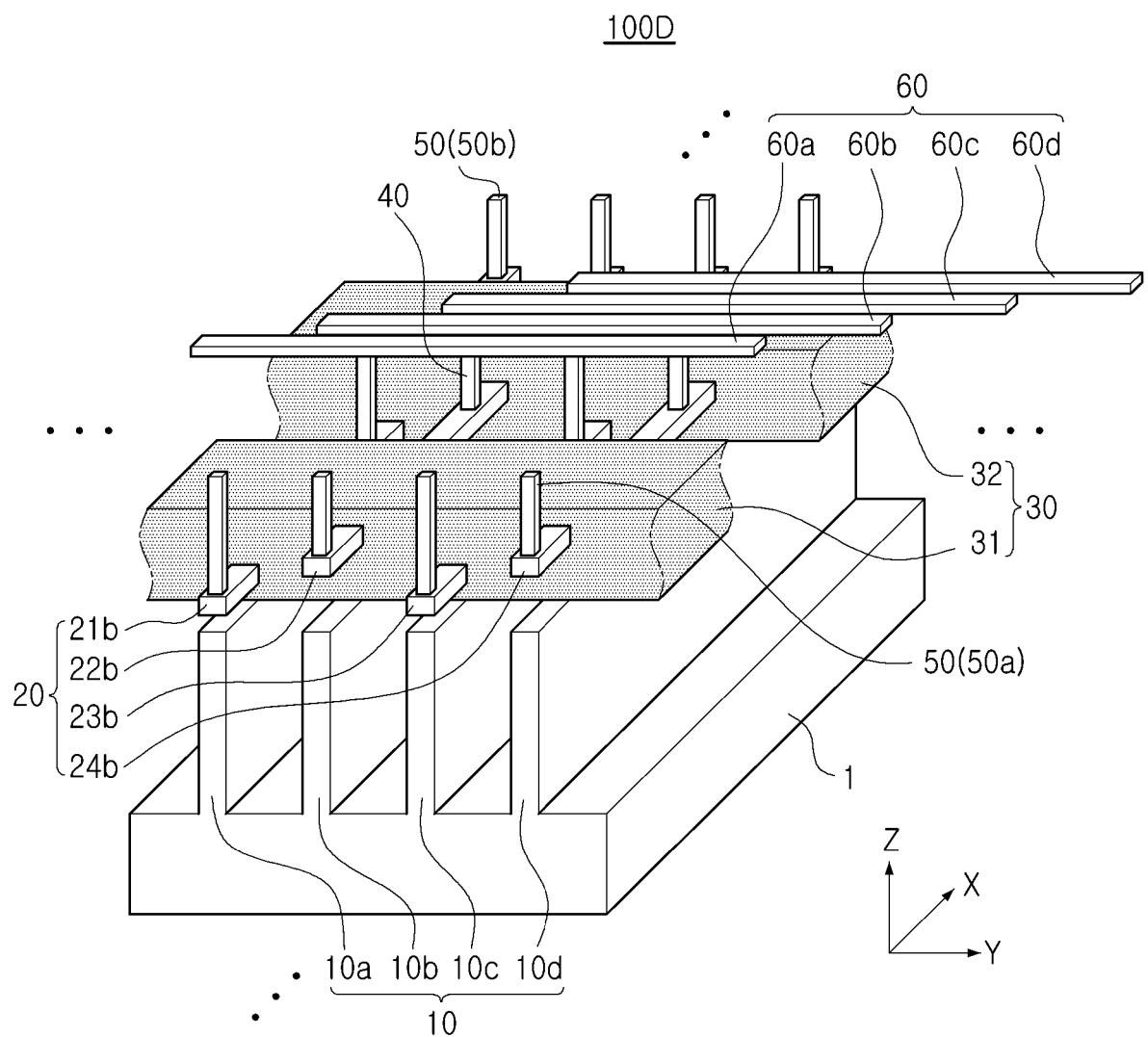
FIG. 7 is a schematic perspective view of a semiconductor device according to an example embodiment.

FIG. 7 is a schematic perspective view of a semiconductor device according to an example embodiment. In FIG. 7, display of the capacitors 70 disposed on the second contact plugs 50 is omitted.

Referring to FIG. 7, in a semiconductor device 100D, a plurality of fin patterns 10 may include first to fourth fin patterns 10a, 10b, 10c, and 10d, and a plurality of active layers 20 may include first to fourth active layers 21b, 22b, 23b, and 24b disposed in positions overlapping each of the first to fourth fin patterns 10a, 10b, 10c, and 10d. The arrangement of the first to fourth active layers 21b, 22b, 23b, and 24b adjacent to each other may have a zigzag shape in which the height changes in the Z-direction along the Y-direction (e.g., when traversing in the Y-direction) as viewed from the X-direction. Disposing in a "zigzag" means that at least three layers, for example, the first to third active layers 21b, 22b, and 23b, when viewed in the X-direction, are disposed to be spaced apart from each other in a right upward direction (/) and in a right downward direction (\). The height of the capacitor contact plugs 50 may also vary accordingly.

Figure 8:
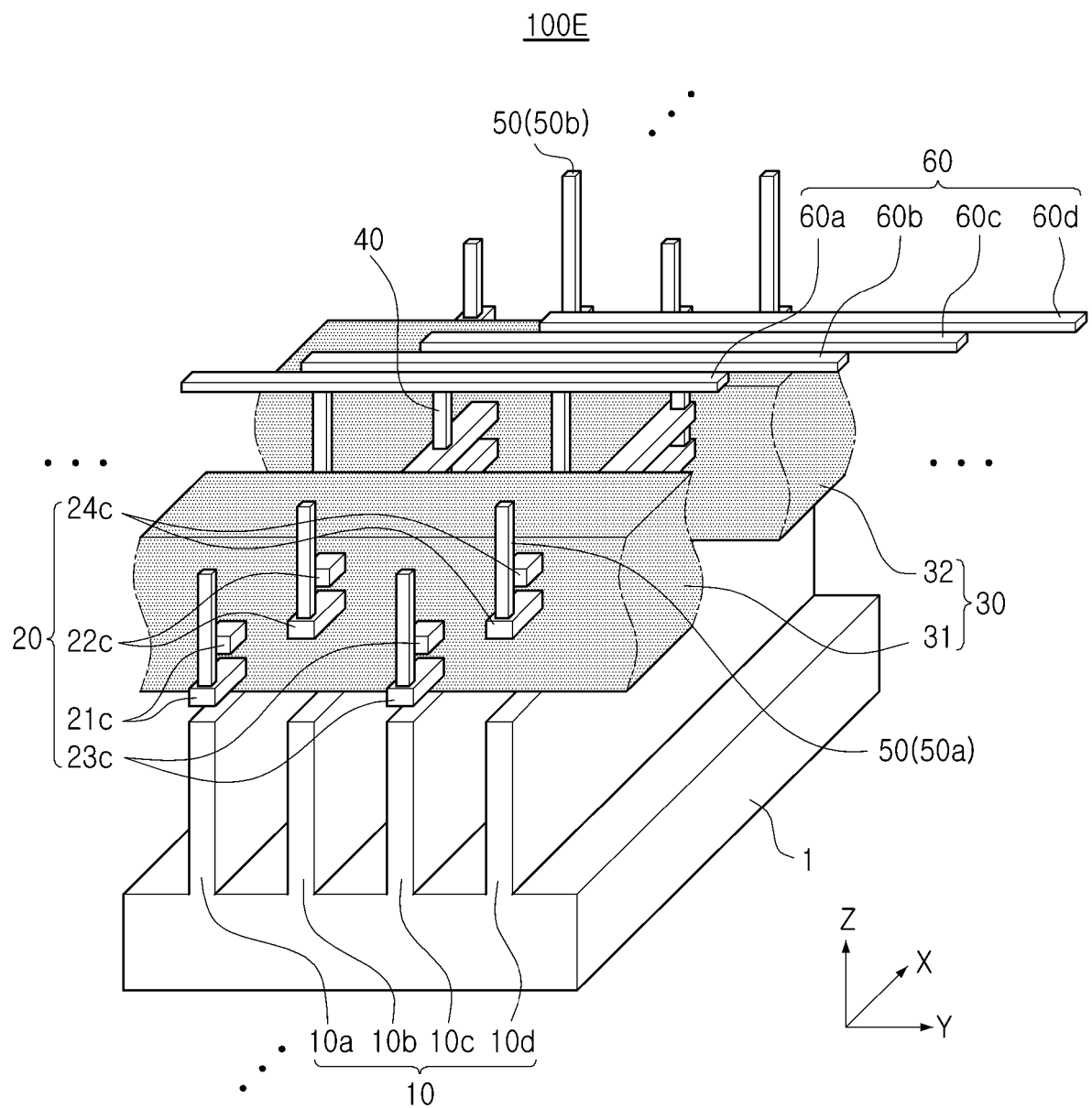
FIG. 8 is a schematic perspective view of a semiconductor device according to an example embodiment.

FIG. 8 is a schematic perspective view of a semiconductor device according to an example embodiment. In FIG. 8, display of the capacitors 70 disposed on the second contact plugs 50 is omitted.

Referring to FIG. 8, a semiconductor device 100E is an example embodiment of a combination of the semiconductor device 100C of FIG. 6 and the semiconductor device 100D of FIG. 7, in which the arrangement of the first to fourth active layer groups 21c, 22c, 23c, and 24c of the plurality of active layers 20 may be in a zigzag shape in which the height in the Z-direction is changed in the Y-direction when viewed from the X-direction, and the plurality of active layers included in the first to fourth active layer groups 21c, 22c, 23c, and 24c may be disposed at different heights, and end surfaces thereof may not be aligned in the Z-direction. For example, an end surface of an upper active layer facing in the X-direction, among the plurality of active layers included in each of the first to fourth active layer groups 21c, 22c, 23c, and 24c may vertically overlap a lower active layer. A second lower active layer 22c of the second active layer group 22c may be disposed at a level higher than a level of the first lower active layer 21c and the first upper active layer 21c of the first active layer group 21c, but the present inventive concept is not limited thereto.

The plurality of bit line contact plugs 40 may electrically connect the first to fourth active layer groups 21c, 22c, 23c, and 24c and the first to fourth bit lines 60a, 60b, 60c, and 60d to each other, respectively. The plurality of bit line contact plugs 40 may respectively pass through the first to fourth upper active layers 21c, 22c, 23c, and 24c and may be directly connected to the first to fourth lower active layers 21c, 22c, 23c, and 24c between the first side surface of the first gate 31 and the third side surface of the second gate 32.

Some 50a of the plurality of capacitor contact plugs 50 may be respectively connected to the first to fourth lower active layers 21c, 22c, 23c, and 24c protruding from the second side surface of the first gate 31, and the others 50b of the plurality of capacitor contact plugs 50 may be connected to the first to fourth upper active layers 21c, 22c, 23c, and 24c protruding from the fourth side surface of the second gate 32. Some 50a of the plurality of capacitor contact plugs 50 may not vertically overlap the first to fourth upper active layers 21c, 22c, 23c, and 24c.

Figure 9:
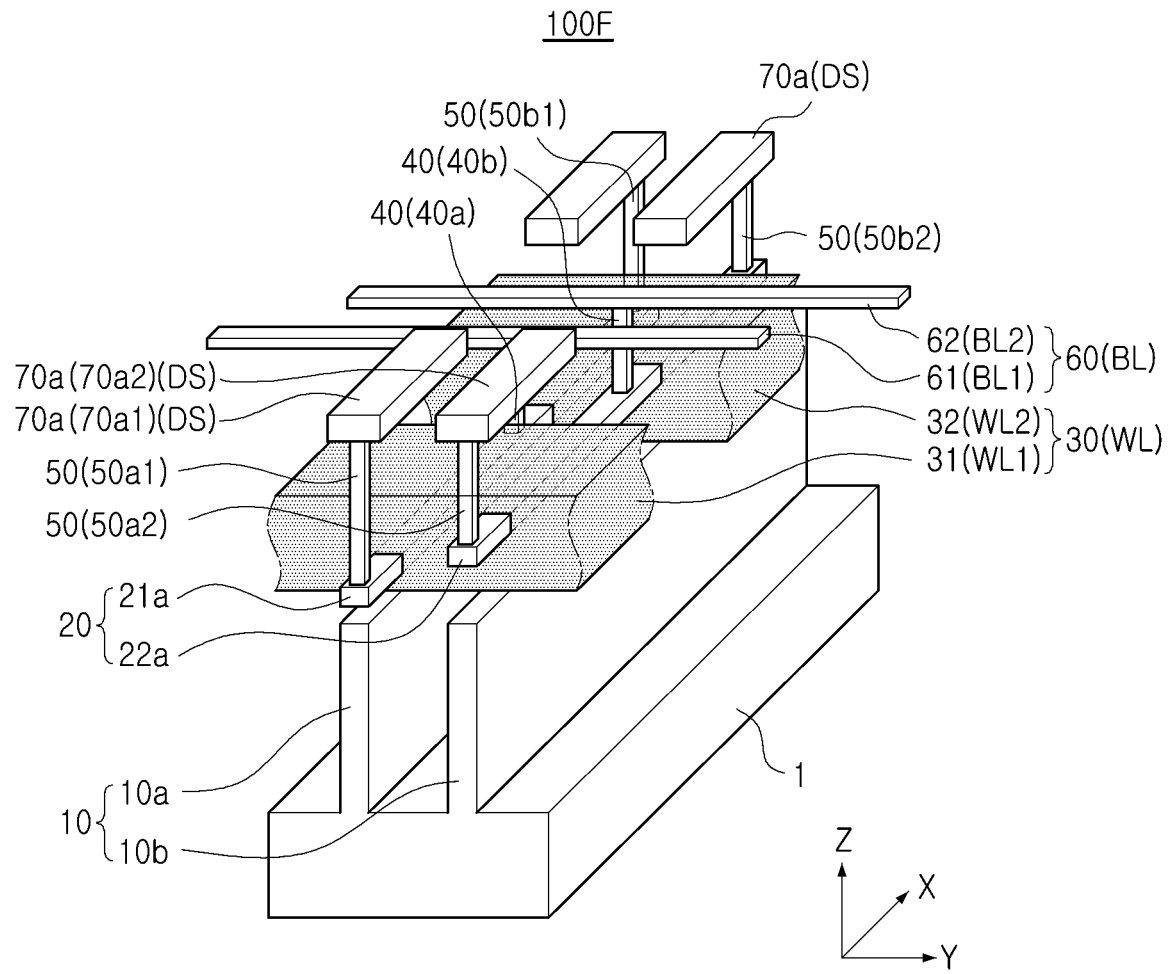
FIG. 9 is a schematic perspective view of a semiconductor device according to an example embodiment.

FIG. 9 is a schematic perspective view of a semiconductor device according to an example embodiment.

Referring to FIG. 9, in a semiconductor device 100F, capacitors 70a may have a structure bent from the capacitor contact plugs 50 in the X-direction, unlike the previous example embodiments. For example, a lower electrode 70a1 of a first capacitor 70a electrically connected to the first contact plug 50a1 may be bent from the first contact plug 50a1 in the X-direction to vertically overlap the first gate 31, and a lower electrode 70a2 of a second capacitor 70a electrically connected to the second contact plug 50a2 may be bent from the second contact plug 50a2 in the X-direction to vertically overlap the first gate 31. The lower electrode 70a1 of the first capacitor 70a may vertically overlap first contact plug 50a1 and the first gate 31. The lower electrode 70a2 of the second capacitor 70b may vertically overlap the second contact plug 50a2 and the first gate 31. For example, the lower electrode 70a1 and 70a2 of each of the capacitors 70a may have a structure in which a length in the X-direction is longer than a length in the Y-direction, and so the capacitors 70a may extend in the X direction, and may be described as horizontally-extending capacitors. The heights at which the first and second lower electrodes 70a1 and 70a2 of the capacitors 70a are disposed may be the same as or different from each other. Similar capacitors (e.g., horizontally-extending capacitors), for example which vertically overlap gates, may be used in the embodiments depicted in FIGS. 1-8. For example, in one embodiment, the capacitors shown in FIG. 9 are used as the capacitors in FIGS. 1 and 2A-2C; and in another embodiment, the capacitors shown in FIG. 9 are used as the capacitors of FIG. 5, 6, 7, or 8. In yet other embodiments, the capacitors shown in FIG. 9 can be used in any of the embodiments shown in FIG. 10, 11A-11B, 12A-12B, or 13A-13B.

Figure 10:
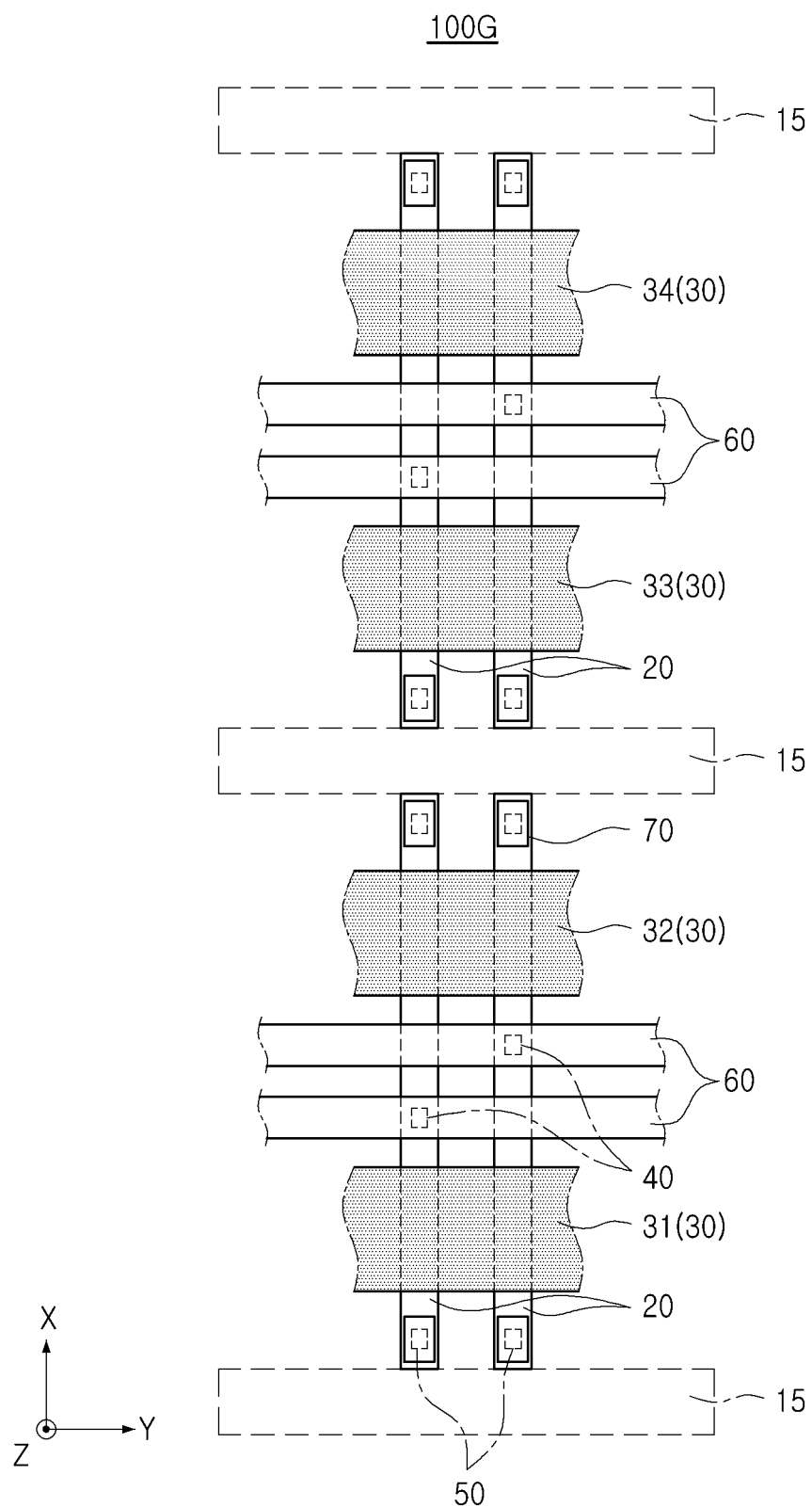
FIG. 10 is a schematic plan view of a semiconductor device according to an example embodiment.

FIG. 10 is a schematic plan view of a semiconductor device according to an example embodiment.

Referring to FIG. 10, the semiconductor device 100G may further include separation patterns 15 separating the plurality of active layers 20 in the X-direction. The separation patterns 15 may extend in the Y-direction and may be formed of an insulating material. The separation patterns 15 may be disposed to pass through the active layers 20 between the second gate 32 and the third gate 33 to provide contact regions respectively connected to the plurality of active layers 20 in a region between the first gate 31 and second gate 32, and between the third gate 33 and the fourth gate 34. The separation patterns 15 may serve to support the plurality of active layers 20 to prevent them from collapsing in a process of removing sacrificial layers disposed between the active layers 20 to form the plurality of active layers 20 during a manufacturing process of the semiconductor device, but the present inventive concept is not limited thereto. Separation patterns such as shown in FIG. 10 may be used in any of the embodiments described in FIG. 1-9, 11A-11B, 12A-12B, or 13A-13B.

FIGS. 11A, 11B, 12A, 12B, 13A, and 13B are views illustrating cross-sections of a semiconductor device according to an example embodiment in a direction in which a fin pattern or active layer extends. The shapes used in these cross sections may apply to any of the disclosed embodiments. The orientation of these cross sections may apply, for example, to FIG. 8, or may be an alternative modified version of FIG. 8.

Referring to FIGS. 11A, 11B, 12A, 12B, 13A, and 13B, the gate 30 may include a gate dielectric layer 35 and a gate electrode 38. The gate dielectric layer 35 may surround and contact the active layers 20, and the gate electrode 38 may surround the gate dielectric layer 35.

The gate dielectric layer 35 may include or be formed of oxide, nitride, or a high-k material. The high-k material may refer to a dielectric material having a dielectric constant higher than that of a silicon oxide layer ($SiO_2$). The high-k material may be any one of, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xOy$), lanthanum hafnium oxide ($LaHf_xO_y$), hafnium aluminum oxide ($HfAl_xO_y$), and praseodymium oxide ($Pr_2O_3$).

The gate electrode 38 may include or be formed of a conductive material, and may include or be formed of a semiconductor material such as doped polysilicon. The gate electrode 38 may include or be formed of, for example, a material such as TiN, TiC, TiAl, TiAlN, TiSiN, TiAlC, TaN, TaC, TaAl, TaAlN, WN, Al, W, and Mo. In example embodiments, the gate electrode 38 may be formed of a single layer or multiple layers.

Figure 11A:
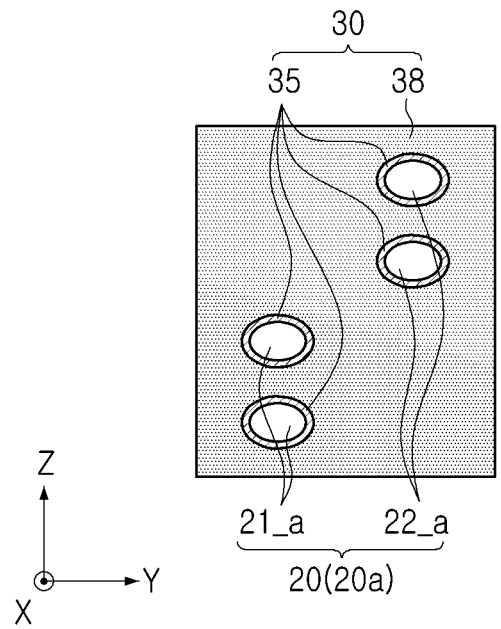
FIGS. 11A, 11B, 12A, 12B, 13A, and 13B are views illustrating cross-sections of a semiconductor device according to an example embodiment in a direction in which a gate extends.
Figure 11B:
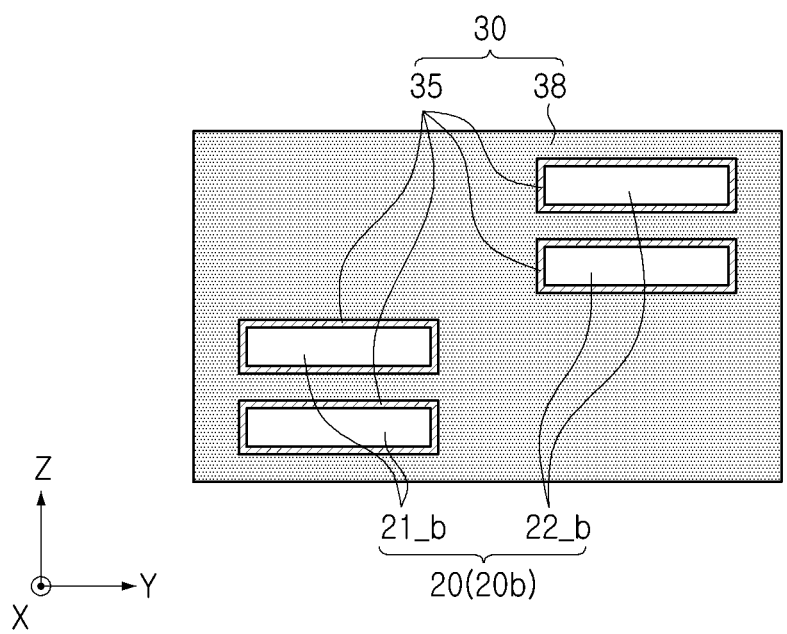
Figure 12A:
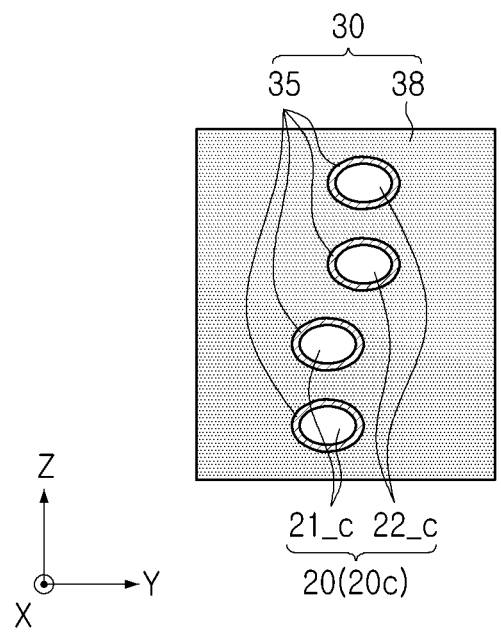
Figure 12B:
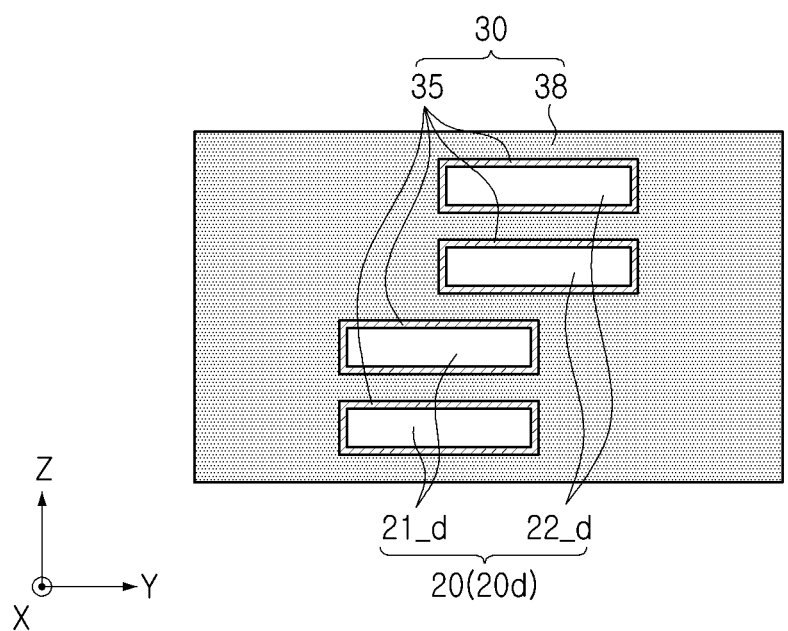
Figure 13A:
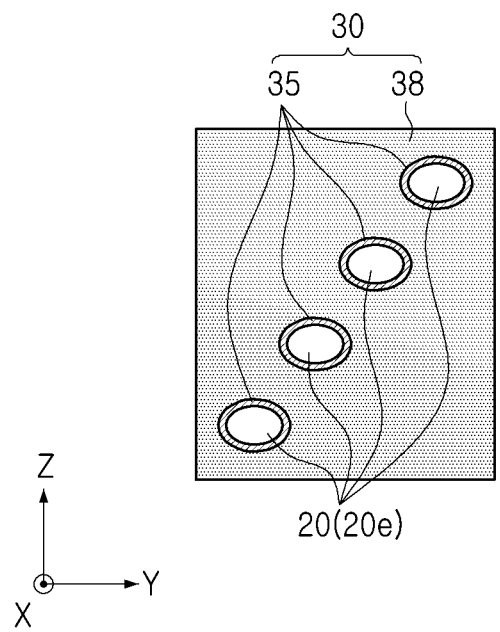
Figure 13B:
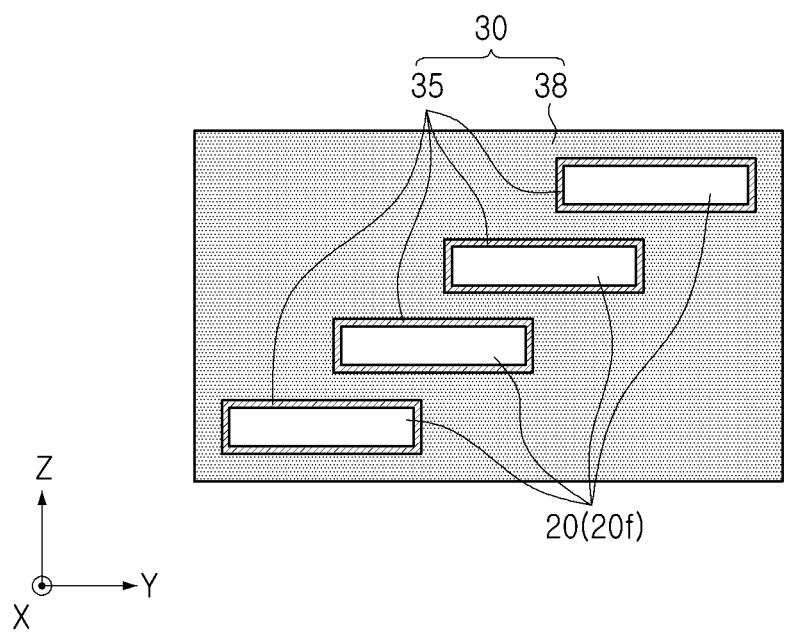

The active layers 20a of FIG. 11A, the active layers 20c of FIG. 12A, and the active layers 20e of FIG. 13A may have the structure of a nano-wire having circular or oval cross-sections, and the active layers 20b of FIG. 11B, the active layers 20d of FIG. 12B, and the active layers 20f of FIG. 13B may have a nano-sheet structure in which cross-sections have an elongated length in the Y-direction, and may have a rectangular cross-section.

The first active layers 21_a having central axes on the same line in the Z-direction, among the active layers 20a of FIG. 11A, may be disposed so that end surfaces facing in the X-direction are not aligned with each other in the Z-direction, and the second active layers 22_a of FIG. 11A may be disposed so that end surfaces facing in the X-direction are not aligned with each other in the Z-direction. The second active layers 22_a may be disposed at levels higher than levels of the first active layers 21_a in the Z-direction and may not overlap the first active layers 21_a in the Y-direction.

Among the active layers 20b of FIG. 11B, the first active layers 21_b having the central axes on the same line in the Z-direction may be disposed so that end surfaces facing in the X-direction are not aligned with each other in the Z-direction, and the active layers 22_b of FIG. 11B may be disposed so that end surfaces facing in the X-direction are not aligned with each other in the Z-direction. The second active layers 22_b may be disposed at levels higher than levels of the first active layers 21_b in the Z-direction and may not overlap the first active layers 21_b in the Y-direction.

Among the active layers 20c of FIG. 12A, the first active layers 21_c having the central axes on the same line in the Z-direction may be disposed so that end surfaces facing in the X-direction are not aligned with each other in the Z-direction, and the second active layer 22_c of FIG. 12A may be disposed so that end surfaces facing in the X-direction are not aligned with each other in the Z-direction. The second active layers 22_c may be disposed on levels higher than levels of the first active layers 21_c in the Z-direction and may not overlap the first active layers 21_c in the Y-direction. However, a partial region of each of the second active layers 22_c may overlap a partial region of each of the first active layers 21_c in the Z-direction.

Among the active layers 20d of FIG. 12B, the first active layers 21_d having the central axes on the same line in the Z-direction may be disposed so that end surfaces facing in the X-direction are not aligned with each other in the Z-direction, and the second active layers 22_d of FIG. 12b may be disposed so that end surfaces facing in the X-direction are not aligned with each other in the Z-direction. The second active layers 22_d may be disposed at levels higher than a levels of the first active layers 21_d in the Z-direction and may not overlap the first active layers 21_d in the Y-direction. However, a partial region of each of the second active layers 22_d may overlap a partial region of each of the first active layers 21_d in the Z-direction.

The active layers 20e of FIG. 13A may be disposed so that end surfaces facing in the X-direction are not aligned with each other in the Z-direction. The active layers 20e may be disposed at different levels in the Z-direction and may not overlap each other in the Y-direction. The active layers 20e may be disposed to form a step structure in the Y-direction, and each active layer 20e may partially overlap at least one other active layer 20e in the Z-direction.

The active layers 20f of FIG. 13B may be disposed so that end surfaces facing in the X-direction are not aligned with each other in the Z-direction. The active layers 20f may be disposed at different levels in the Z-direction and may not overlap each other in the Y-direction. The active layers 20f may be disposed to form a step structure in the Y-direction, and each active layer 20f may partially overlap at least one other active layer 20f in the Z-direction.

Figure 14:
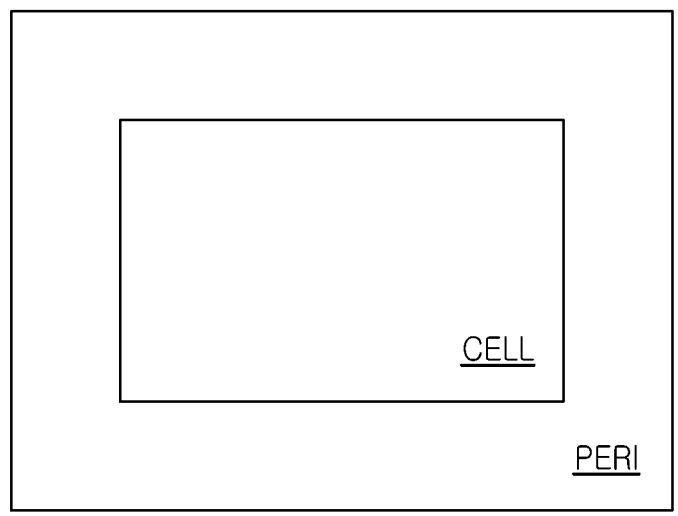
FIG. 14 is a schematic plan view of a semiconductor device according to an example embodiment.

FIG. 14 is a schematic plan view of a semiconductor device according to an example embodiment.

Figure 15A:
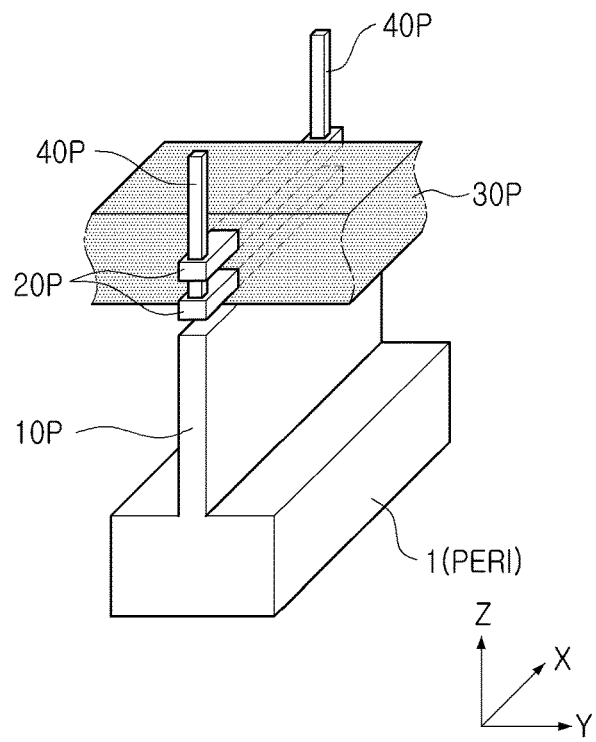
FIGS. 15A, 15B, and 15C are perspective views illustrating circuit devices disposed in a peripheral region of the semiconductor device of FIG. 14.
Figure 15B:
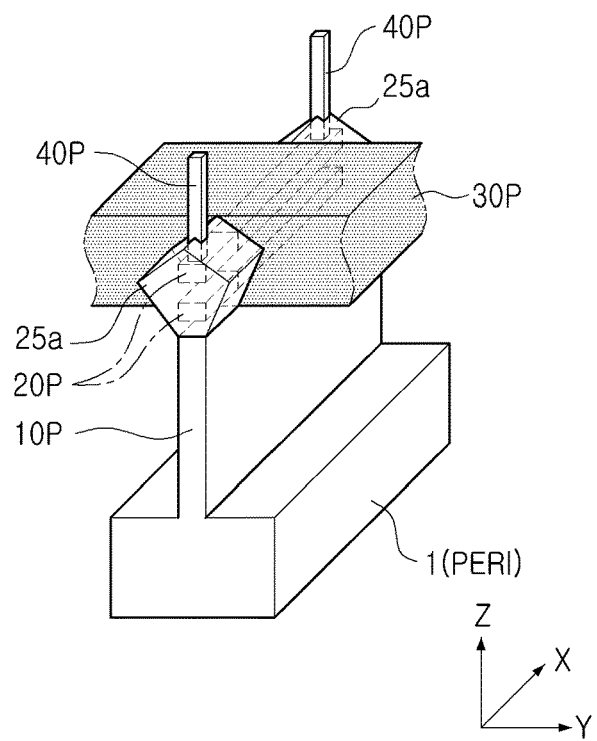
Figure 15C:
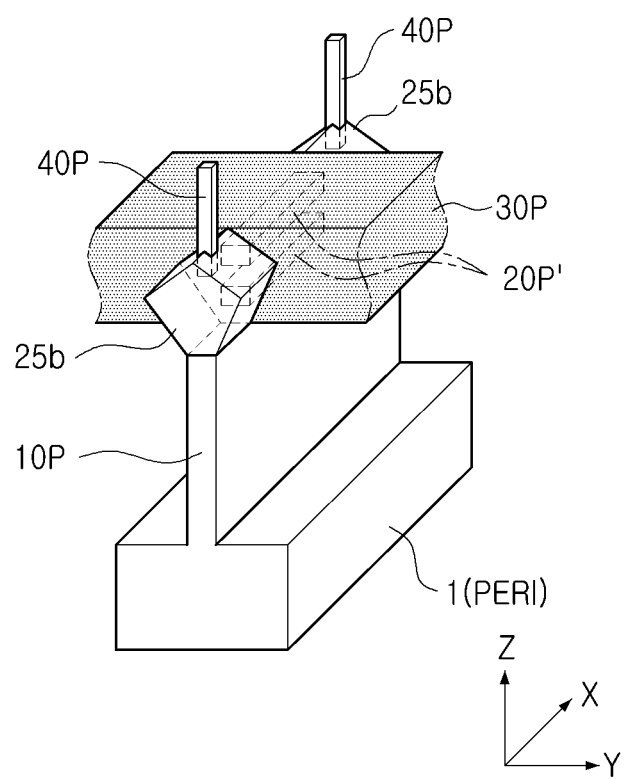

FIGS. 15A, 15B, and 15C are perspective views illustrating circuit devices disposed in a peripheral region of the semiconductor device of FIG. 14.

Referring to FIG. 14, a semiconductor device 200 according to an example embodiment may include a cell region CELL and a peripheral region PERI. The peripheral region PERI may be disposed around the cell region CELL to surround at least a portion of the cell region CELL. The cell region CELL may be a region in which memory cells are disposed, in which the devices described above with reference to FIGS. 1 to 13B may be disposed. The peripheral region PERI may be a region including peripheral circuits for driving the cell region CELL, in which a word line driver, a sense amplifier, row and column decoders, and control circuits may be arranged.

Operations of forming the active layers 20 and the gates 30 on the substrate 1 of the cell region CELL may be performed equally, simultaneously also in the peripheral region PERI. Accordingly, peripheral transistors constituting the peripheral circuits of the peripheral region PERI may include MBCFET™, GAAFET, nano-sheet transistors, or nano-wire transistors. Since memory cell transistors of the cell region CELL and the peripheral transistors of the peripheral region PERI may be formed through the same operations, the manufacturing costs of the semiconductor device may be reduced and the manufacturing process of the semiconductor device may be simplified.

In some example embodiments, a hard mask may be formed on the peripheral region PERI and predetermined processes may be performed only on the cell region CELL, or a hard mask may be formed on the cell region CELL, and predetermined processes may be performed only on the peripheral region PERI.

Hereinafter, devices disposed in the peripheral region PERI of the semiconductor device 200 will be further described.

Referring to FIGS. 14 and 15A, the semiconductor device 200 may include a peripheral fin pattern 10P, peripheral active layers 20P, a peripheral gate 30P, and peripheral contacts plugs 40P on the peripheral region PERI of the substrate 1. The peripheral gate 30P may surround the peripheral active layers 20P. The peripheral active layers 20P may include a first peripheral active layer 20P and a second peripheral active layer 20P on the first peripheral active layer 20P. The peripheral contact plugs 40P may pass through the second peripheral active layer 20P and may be connected to the first peripheral active layer 20P and the second peripheral active layer 20P. The peripheral active layers 20P protruding toward a first side of the peripheral gate 30P may be electrically connected to each other by the first peripheral contact plug 40P, and may provide a first source/drain region of the transistor. The peripheral active layers 20P protruding toward a second side of the peripheral gate 30P may be electrically connected to each other by the second peripheral contact plug 40P, and may provide a second source/drain region of the transistor.

Referring to FIGS. 14 and 15B, the semiconductor device 200 has a configuration similar to that of FIG. 15A, but may further include epitaxial layers 25a grown from the peripheral active layers 20P by performing an epitaxial growth process. The epitaxial layers 25a may have a structure surrounding the peripheral active layers 20P. The epitaxial layers 25 may be respectively disposed on both sides of the peripheral gate 30P, and may provide a source region and a drain region of the transistor, respectively. The epitaxial layers 25 may include impurities, and may include a plurality of layers having different compositions of impurities and/or semiconductor materials. The peripheral contact plugs 40P may be stably connected to the epitaxial layers 25a that are source/drain regions.

Referring to FIGS. 14 and 15C, the semiconductor device 200 has a configuration similar to that of FIG. 15B, but may further include epitaxial layers 25b formed by partially removing the peripheral active layers 20P and then performing an epitaxial growth process. Portions of the peripheral active layers 20P exposed from the peripheral gate 30P may be removed to form peripheral active layers 20P'. The epitaxial layers 25b are respectively disposed on both sides of the peripheral gate 30P to provide a source region and a drain region of the transistor, respectively.

By disposing the active layers, surrounded by the gate, in a zigzag manner in at least one direction (e.g., as viewed from the X-Z plane in FIGS. 2A-2C, from the Y-Z plane in FIGS. 4A-4C, etc.), a semiconductor device having improved electrical characteristics and improved integration may be provided.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a first fin protruding from a top surface of a substrate and extending in a first direction;
a first active layer and a second active layer extending in the first direction on the first fin, the second active layer being disposed at a level higher than a level of the first active layer, the first active layer and the second active layer forming a first active layer structure;
a first gate intersecting the first and second active layers, surrounding upper and lower surfaces and opposing side surfaces of each of the first and second active layers, and extending in a second direction, intersecting the first direction;
a second gate intersecting the first and second active layers, surrounding upper and lower surfaces and opposing side surfaces of each of the first and second active layers, extending in the second direction, and disposed to be parallel to the first gate;
first to third contact plugs on the first active layer structure;
first and second capacitors electrically connected to the first and second contact plugs, respectively; and
a first bit line electrically connected to the third contact plug and extending in the second direction,
wherein the first active layer includes a first region extending from a first overlapping region of the first active layer overlapping the first gate by a first length in a direction away from the second gate, and
wherein the second active layer includes a first region extending from a first overlapping region of the second active layer overlapping the first gate by a second length in a direction away from the second gate, the second length shorter than the first length.

2. The semiconductor device of claim 1, wherein:
the second active layer includes a second region extending from a second overlapping region overlapping the second gate in a direction away from the first gate,
the first contact plug is directly connected to the first region of the first active layer, and
the second contact plug is directly connected to the second region of the second active layer.

3. The semiconductor device of claim 2, wherein the third contact plug is disposed between the first gate and the second gate.

4. The semiconductor device of claim 3, wherein the third contact plug passes through the second active layer and is directly connected to the first active layer and the second active layer.

5. The semiconductor device of claim 2, further comprising:
a second fin protruding from the substrate, extending in the first direction, and disposed to be parallel to the first fin;
a third active layer and a fourth active layer extending in the first direction on the second fin and having upper and lower surfaces and opposing side surfaces surrounded by the first and second gates, the fourth active layer being disposed at a level higher than a level of the third active layer, the third active layer and the fourth active layer forming a second active layer structure;
fourth to sixth contact plugs on the second active layer structure;
third and fourth capacitors electrically connected to the fourth and fifth contact plugs, respectively; and
a second bit line electrically connected to the sixth contact plug and extending in the second direction,
wherein the third active layer includes a first region extending from a first overlapping region of the third active layer overlapping the first gate by a third length in a direction away from the second gate, and
wherein the fourth active layer includes a first region extending from a first overlapping region of the fourth active layer overlapping the first gate by a fourth length in a direction away from the second gate, the fourth length shorter than the third length.

6. The semiconductor device of claim 5, wherein
the fourth active layer includes a second region extending from a second overlapping region of the fourth active layer overlapping the second gate in a direction away from the first gate,
the fourth contact plug is directly connected to the first region of the third active layer, and
the fifth contact plug is directly connected to the second region of the fourth active layer.

7. The semiconductor device of claim 6, wherein the sixth contact plug passes through the fourth active layer and is directly connected to the third active layer and the fourth active layer.

8. The semiconductor device of claim 6, wherein the third active layer is disposed at a level higher than a level of the first active layer.

9. The semiconductor device of claim 1, wherein:
the second active layer has a first end surface and a second end surface opposite to each other in the first direction, and
the first end surface of the second active layer vertically overlaps the first region of the first active layer.

10. The semiconductor device of claim 1, wherein:
the first active layer extends continuously from a portion crossing the first gate in the first direction to cross the second gate, and the second active layer extends continuously from the portion crossing the first gate in the first direction to cross the second gate.

11. A semiconductor device comprising:
a first fin pattern protruding from a substrate and extending in a first direction;
a second fin pattern protruding from the substrate, extending in the first direction, and disposed to be parallel to the first fin pattern;
a first active layer extending in the first direction on the first fin pattern;
a second active layer extending in the first direction on the second fin pattern;
a first gate intersecting the first and second active layers, surrounding upper and lower surfaces and opposing side surfaces of each of the first and second active layers, and extending in a second direction, intersecting the first direction;
a second gate intersecting the first and second active layers, surrounding upper and lower surfaces and opposing side surfaces of each of the first and second active layers, extending in the second direction, and disposed to be parallel to the first gate;
a first bit line contact plug directly connected to the first active layer between the first gate and the second gate;
a second bit line contact plug directly connected to the second active layer between the first gate and the second gate;
a first bit line connected to the first bit line contact plug and extending in the second direction;
a second bit line connected to the second bit line contact plug and extending in the second direction;
a first additional contact plug directly connected to a first region of the first active layer; and
a second additional contact plug directly connected to a first region of the second active layer;
wherein the first region of the first active layer is a region extending from a first overlapping region of the first active layer overlapping the first gate in a direction away from the second gate,
wherein the first region of the second active layer is a region extending from a first overlapping region of the second active layer overlapping the first gate in a direction away from the second gate, and
wherein the first region of the second active layer is disposed at a level higher than a level of the first region of the first active layer.

12. The semiconductor device of claim 11, further comprising:
a third contact plug directly connected to a second region of the first active layer; and
a fourth contact plug directly connected to a second region of the second active layer,
wherein the second region of the first active layer is a region extending from a second overlapping region of the first active layer overlapping the second gate in a direction away from the first gate,
wherein the second region of the second active layer is a region extending from a second overlapping region of the second active layer overlapping the second gate in a direction away from the first gate, and
wherein the second region of the second active layer is disposed at a level higher than a level of the first region of the first active layer.

13. The semiconductor device of claim 12, wherein:
the first active layer includes a third region directly connected to the first bit line contact plug, and
the third region of the first active layer is disposed between the first overlapping region of the first active layer and the second overlapping region of the first active layer.

14. The semiconductor device of claim 13, wherein:
the second active layer includes a third region directly connected to the second bit line contact plug, and
the third region of the second active layer is disposed between the first overlapping region of the second active layer and the second overlapping region of the second active layer.

15. The semiconductor device of claim 11, wherein the first bit line contact plug and the second bit line contact plug are disposed not to overlap each other in either of the first direction and the second direction.

16. The semiconductor device of claim 11, further comprising:
a first upper active layer extending in the first direction on the first active layer; and
a second upper active layer extending in the first direction on the second active layer,
wherein:
the first region of the first active layer extends by a first length in the first direction,
the first upper active layer extends by a second length from a region of the first upper active layer overlapping the first gate to in a direction away from the second gate, the second length shorter than the first length,
the first region of the second active layer extends by a third length in the first direction, and
the second upper active layer extends from a region of the second upper active layer overlapping the first gate by a fourth length in a direction away from the second gate, the fourth length shorter than the third length.

17. The semiconductor device of claim 16, wherein
the first bit line contact plug passes through the first upper active layer, and
the second bit line contact plug passes through the second upper active layer.

18. A semiconductor device comprising:
a first fin pattern protruding from a substrate and extending in a first direction;
a second fin pattern protruding from the substrate, extending in the first direction, and disposed to be parallel to the first fin pattern;
a first active layer extending in the first direction on the first fin pattern;
a second active layer extending in the first direction on the second fin pattern;
a first gate intersecting the first and second active layers, surrounding upper and lower surfaces and opposing side surfaces of each of the first and second active layers, and extending in a second direction, intersecting the first direction;
a second gate intersecting the first and second active layers, surrounding upper and lower surfaces and opposing side surfaces of each of the first and second active layers, extending in the second direction, and disposed to be parallel to the first gate;
wherein the first gate includes a first side surface facing the second gate and a second side surface opposite to the first side surface;
a first contact plug directly connected to a first region of the first active layer on the second side surface of the first gate;

a second contact plug directly connected to a first region of the second active layer on the second side surface of the first gate;

a first lower electrode of a first capacitor electrically connected to the first contact plug; and a second lower electrode of a second capacitor electrically connected to the second contact plug, wherein the first region of the second active layer is disposed at a level higher than a level of the first region of the first active layer, wherein the first lower electrode of the first capacitor vertically overlaps the first contact plug and the first gate, and wherein the second lower electrode of the second capacitor vertically overlaps the second contact plug and the first gate.

19. The semiconductor device of claim 18, wherein the first lower electrode of the first capacitor and the second lower electrode of the second capacitor each have a shape longer in length in the first direction than in the second direction.

20. The semiconductor device of claim 18, further comprising:

a first bit line contact plug directly connected to the first active layer between the first gate and the second gate;

a second bit line contact plug directly connected to the second active layer between the first gate and the second gate;

a first bit line connected to the first bit line contact plug and extending in the second direction; and a second bit line connected to the second bit line contact plug and extending in the second direction.

* * * * *